(12) United States Patent
Zhai et al.

(10) Patent No.: US 11,056,373 B2
(45) Date of Patent: Jul. 6, 2021

(54) 3D FANOUT STACKING

(71) Applicant: Apple Inc., Cupertino, CA (US)

(72) Inventors: Jun Zhai, Cupertino, CA (US);
Kwan-Yu Lai, Campbell, CA (US);
Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 1386 days.

(21) Appl. No.: 14/918,189

(22) Filed: Oct. 20, 2015

(65) Prior Publication Data

US 2017/0025380 A1    Jan. 26, 2017

Related U.S. Application Data

(60) Provisional application No. 62/195,192, filed on Jul. 21, 2015.

(51) Int. Cl.
*H01L 23/538* (2006.01)
*H01L 21/56* (2006.01)
(Continued)

(52) U.S. Cl.
CPC ...... *H01L 21/6835* (2013.01); *H01L 23/5389* (2013.01); *H01L 24/19* (2013.01);
(Continued)

(58) Field of Classification Search
CPC ..... H01L 24/81; H01L 25/0652; H01L 25/50; H01L 21/76895; H01L 24/11; H01L 21/563; H01L 25/065; H01L 2224/111; H01L 2924/0665; H01L 2924/014; H01L 2225/06572; H01L 2225/0652; H01L 2225/06517; H01L 2225/06524; H01L 25/0655; H01L 24/08; H01L 24/17; H01L 23/3157; H01L 21/565; H01L 24/03; H01L 21/31105; H01L 21/6835; H01L 2224/02311; H01L 2224/02381; H01L 2224/03002; H01L 2224/08137; H01L 2224/02371; H01L 2224/16137; H01L 2924/1432; H01L 2924/1436; H01L 2924/182; H01L 2224/81024

See application file for complete search history.

(56) References Cited

U.S. PATENT DOCUMENTS 7,763,976 B2    7/2010    Tang et al.
8,669,140 B1    3/2014    Muniandy et al.
(Continued)

FOREIGN PATENT DOCUMENTS

JP    2002359345 A  * 12/2002

OTHER PUBLICATIONS

Machine English translation of JP2002-359345. (Year: 2002).*
(Continued)

*Primary Examiner* — Yu Chen
(74) *Attorney, Agent, or Firm* — Aikin & Gallant, LLP

(57) ABSTRACT

Semiconductor packages and fan out die stacking processes are described. In an embodiment, a package includes a first level die and a row of conductive pillars protruding from a front side of the first level die. A second level active die is attached to the front side of the first level die, and a redistribution layer (RDL) is formed on an in electrical contact with the row of conductive pillars and a front side of the second level active die.

17 Claims, 14 Drawing Sheets

(51) Int. Cl.
*H01L 25/065* (2006.01)
*H01L 21/683* (2006.01)
*H01L 23/00* (2006.01)
*H01L 25/03* (2006.01)
*H01L 25/00* (2006.01)
*H01L 23/31* (2006.01)
*H01L 23/498* (2006.01)

(52) U.S. Cl.
CPC .............. *H01L 24/20* (2013.01); *H01L 24/24* (2013.01); *H01L 24/92* (2013.01); *H01L 24/96* (2013.01); *H01L 25/03* (2013.01); *H01L 25/0652* (2013.01); *H01L 25/50* (2013.01); *H01L 21/568* (2013.01); *H01L 23/3128* (2013.01); *H01L 23/49816* (2013.01); *H01L 24/32* (2013.01); *H01L 24/73* (2013.01); *H01L 24/83* (2013.01); *H01L 2224/04105* (2013.01); *H01L 2224/12105* (2013.01); *H01L 2224/19* (2013.01); *H01L 2224/24226* (2013.01); *H01L 2224/32145* (2013.01); *H01L 2224/32225* (2013.01); *H01L 2224/73217* (2013.01); *H01L 2224/73267* (2013.01); *H01L 2224/92144* (2013.01); *H01L 2224/92244* (2013.01); *H01L 2225/06517* (2013.01); *H01L 2225/06548* (2013.01); *H01L 2225/06555* (2013.01); *H01L 2225/06562* (2013.01); *H01L 2225/06586* (2013.01); *H01L 2225/06589* (2013.01); *H01L 2924/1432* (2013.01); *H01L 2924/1436* (2013.01); *H01L 2924/182* (2013.01); *H01L 2924/18162* (2013.01)

(56) References Cited

U.S. PATENT DOCUMENTS

| | | |
|---|---|---|
| 8,822,268 B1 | 9/2014 | Magnus |
| 8,896,109 B2 | 11/2014 | Pagaila et al. |
| 2007/0080442 A1* | 4/2007 | Meyer-Berg ............ H01L 24/06 257/686 |
| 2008/0150157 A1* | 6/2008 | Nishimura .............. H01L 24/13 257/777 |
| 2008/0258288 A1* | 10/2008 | Park ........................ H01L 24/12 257/686 |
| 2010/0013101 A1* | 1/2010 | Hedler .................. H01L 23/552 257/773 |
| 2011/0068427 A1* | 3/2011 | Paek ........................ H01L 24/19 257/433 |
| 2011/0285007 A1* | 11/2011 | Chi ..................... H01L 21/4846 257/686 |
| 2012/0038064 A1* | 2/2012 | Camacho ................ H01L 24/29 257/777 |
| 2013/0147063 A1* | 6/2013 | Park ........................ H01L 24/82 257/777 |
| 2013/0154091 A1 | 6/2013 | Wright et al. |
| 2013/0187292 A1* | 7/2013 | Semmelmeyer .... H01L 25/0652 257/777 |
| 2014/0097535 A1* | 4/2014 | He ..................... H01L 25/0652 257/738 |
| 2014/0103527 A1* | 4/2014 | Marimuthu ......... H01L 21/6835 257/737 |
| 2014/0239497 A1 | 8/2014 | Yap |
| 2015/0001709 A1 | 1/2015 | Bao et al. |
| 2015/0145116 A1 | 5/2015 | Uzoh et al. |
| 2015/0348940 A1* | 12/2015 | Woychik ............. H01L 25/0657 257/774 |
| 2016/0240508 A1* | 8/2016 | Hou .................... H01L 25/0652 |
| 2016/0260684 A1* | 9/2016 | Zhai .................... H01L 25/0652 |
| 2016/0307872 A1* | 10/2016 | Chen .................. H01L 21/4857 |

OTHER PUBLICATIONS

Gibb, Kevin. "The Endless Pursuit of Smaller Packages." EE Times-Asia (2016). https://archive.eetasia.com/www.eetasia.com/ART_8800720276_480200_TA_a0831482_2.HTM.

Karaxi, Evangelia K. et al. "Assessment of Self-Healing Epoxy-Based Coatings Containing Microcapsules Applied on Hot Dipped Galvanized Steel." Frontiers in Materials 6 (2019).

* cited by examiner

```
┌─────────────────────────────────────────────┐
│ ATTACH A BACK SIDE OF A SECOND LEVEL ACTIVE │
│ DIE TO A FRONT SIDE OF ONE OR MORE FIRST LEVEL │
│ DIE SUCH THAT THE SECOND LEVEL ACTIVE DIE IS │──── 2010
│ LATERALLY BETWEEN A FIRST ROW OF CONDUCTIVE │
│ PILLARS AND A SECOND ROW OF CONDUCTIVE      │
│ PILLARS PROTRUDING FROM THE ONE OR MORE FIRST │
│                 LEVEL DIE                   │
└─────────────────────────────────────────────┘
                      │
┌─────────────────────────────────────────────┐
│ ENCAPSULATE THE SECOND LEVEL ACTIVE DIE, THE │
│   FIRST ROW OF CONDUCTIVE PILLARS, AND THE  │──── 2020
│     SECOND ROW OF CONDUCTIVE PILLARS IN A   │
│          MOLDING COMPOUND LAYER             │
└─────────────────────────────────────────────┘
                      │
┌─────────────────────────────────────────────┐
│  REMOVE A THICKNESS OF THE MOLDING COMPOUND │
│   LAYER TO EXPOSE THE FIRST ROW OF CONDUCTIVE │
│  PILLARS, THE SECOND ROW OF CONDUCTIVE PILLARS, │──── 2030
│    AND A FRONT SIDE OF THE SECOND LEVEL ACTIVE │
│                    DIE                      │
└─────────────────────────────────────────────┘
                      │
┌─────────────────────────────────────────────┐
│    FORM A REDISTRIBUTION LAYER ON AND IN    │
│  ELECTRICAL CONNECTION WITH THE FRONT SIDE OF │
│   THE SECOND LEVEL ACTIVE DIE, THE FIRST ROW OF │──── 2040
│   CONDUCTIVE PILLARS, AND THE SECOND ROW OF │
│              CONDUCTIVE PILLARS             │
└─────────────────────────────────────────────┘
```

*FIG. 2*

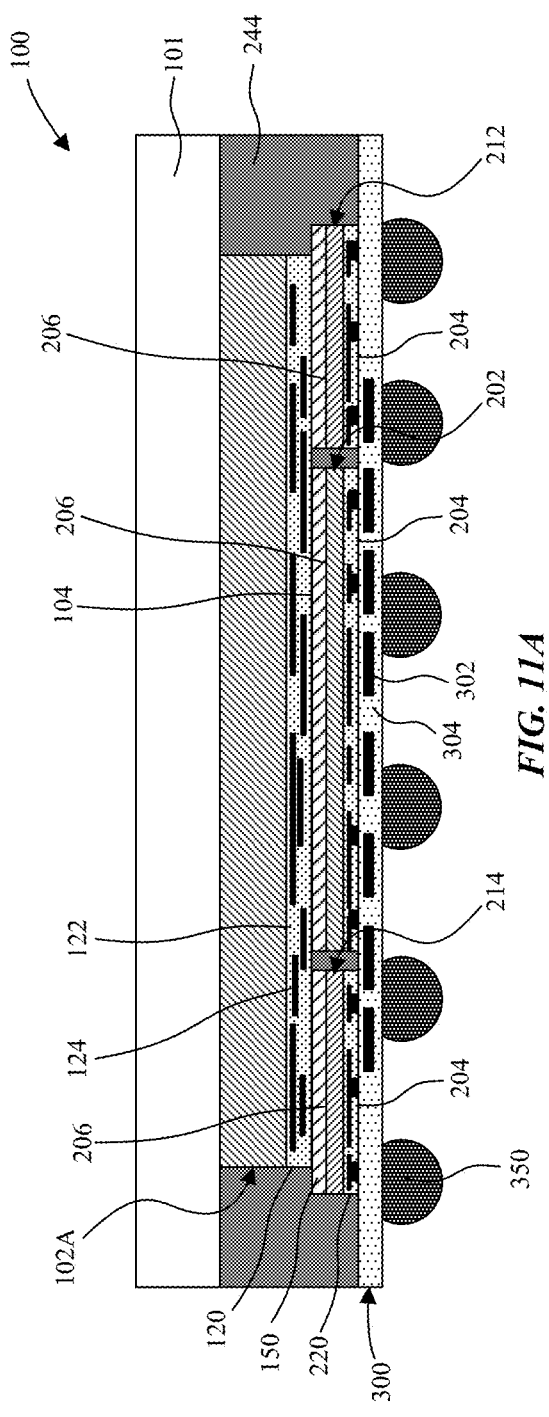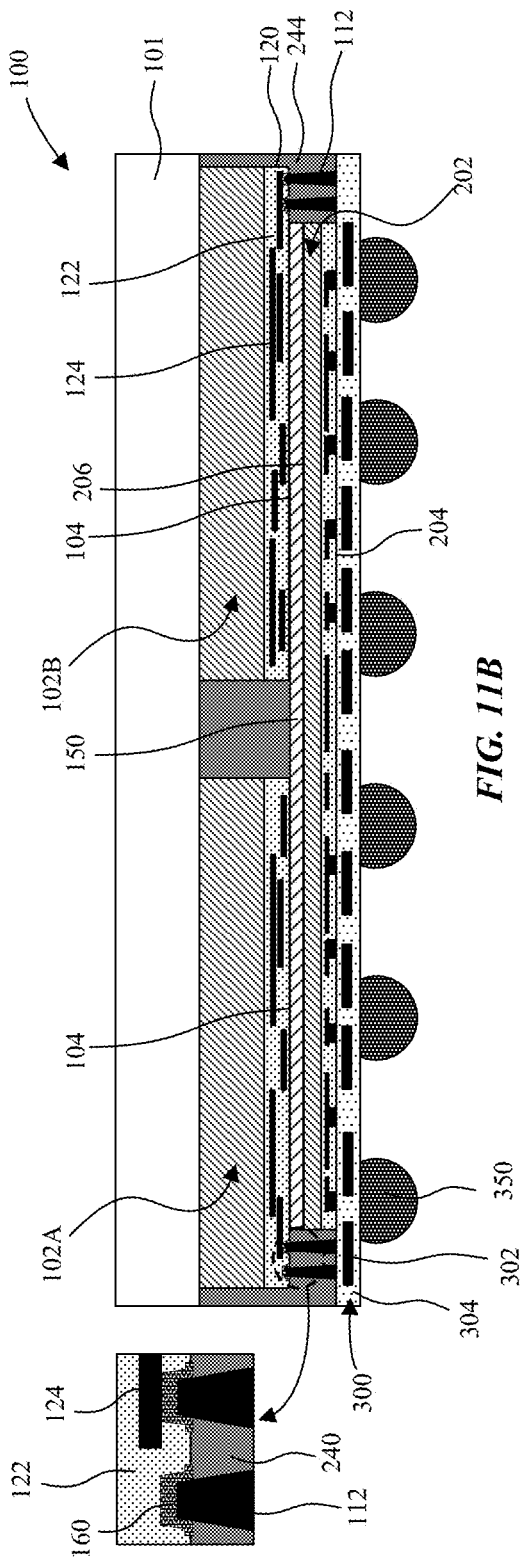
FIG. 11A
FIG. 11B

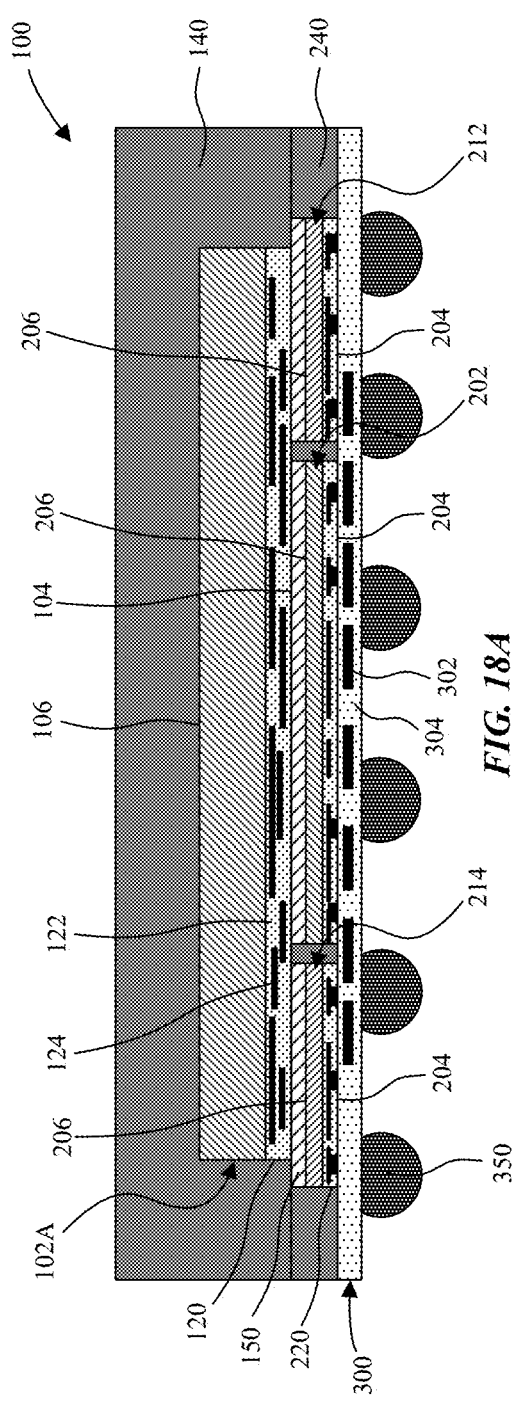
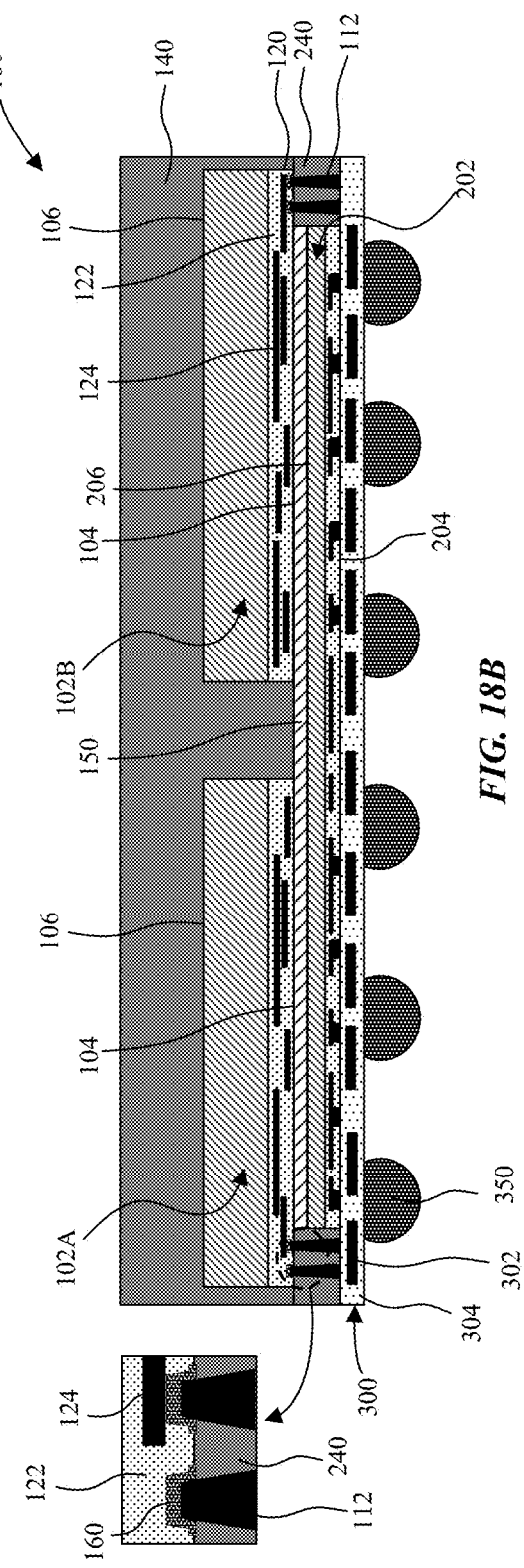
FIG. 18A
FIG. 18B

3D FANOUT STACKING

RELATED APPLICATIONS

This application claims the benefit of priority of U.S. Provisional Application No. 62/195,192 filed Jul. 21, 2015, which is incorporated herein by reference.

BACKGROUND

Field

Embodiments described herein relate to semiconductor packaging. More particularly, embodiments relate to 3D stacking and fan out structures and processes.

Background Information

The current market demand for portable and mobile electronic devices such as mobile phones, personal digital assistants (PDAs), digital cameras, portable players, gaming, and other mobile devices requires the integration of more performance and features into increasingly smaller spaces. Additionally, while the form factor (e.g. thickness) and footprint (e.g. area) for semiconductor die packaging is decreasing, the number of input/output (I/O) pads is increasing.

An exemplary implementation is mobile memory packaging such as wide I/O dynamic random-access memory (DRAM) where the trend continues for more performance, less power consumption, and smaller form-factor. Alternative packaging technologies are currently being explored to replace more traditional packaging technologies such as wire bond package on package (PoP) and wire bond system in package (SiP).

BRIEF DESCRIPTION OF THE DRAWINGS

FIG. 2 is a flow chart illustrating a method of forming a package in accordance with an embodiment.

FIG. 11A is a cross-sectional side view illustration of a package taken along line A-A in FIG. 1B formed using a fan out build up process with pre-formed conductive pillars and single reconstituted carrier substrate in accordance with an embodiment.

FIG. 11B is a cross-sectional side view illustration of a package taken along line B-B in FIG. 1B formed using a fan out build up process with pre-formed conductive pillars and single reconstituted carrier substrate in accordance with an embodiment.

FIG. 18A is a cross-sectional side view illustration of a package taken along line A-A in FIG. 1B formed using a face down reconstituted carrier substrate approach in accordance with an embodiment.

FIG. 18B is a cross-sectional side view illustration of a package taken along line B-B in FIG. 1B formed using a face down reconstituted carrier substrate approach in accordance with an embodiment.

DETAILED DESCRIPTION

Figure 1A:
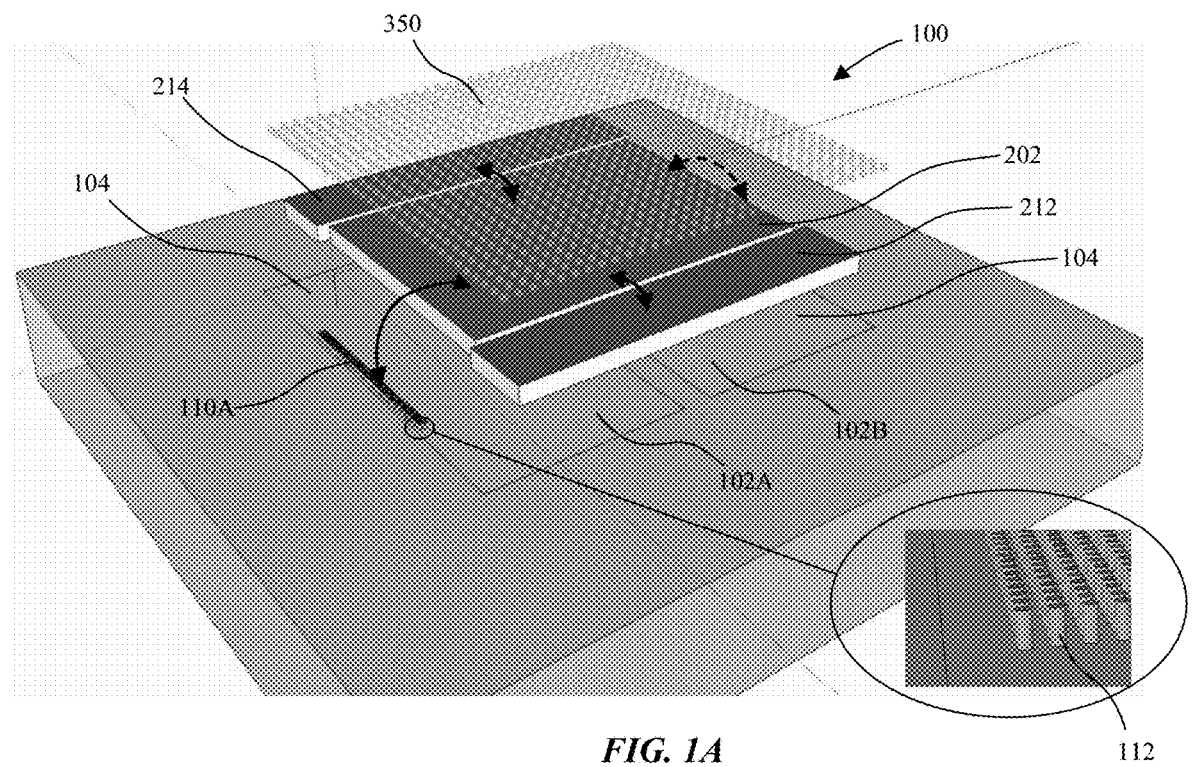
FIG. 1A is a perspective view illustration of a package first and second level die and close-up view of a row of conductive pillars in accordance with an embodiment

Embodiments describe semiconductor packages and fan out die stacking processes. For example, embodiments describe, but are not limited to, 3D memory packages. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "top", "bottom", "front", "back", "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

In one embodiment, a package includes one or more first level die, and a plurality of conductive pillars extending from a front side of the one or more first level die. A back side of a second level active die is attached to the front side of the one or more first level die, and an RDL is formed on and in electrical contact with the plurality of conductive pillars and a front side of the second level active die. In this manner, the RDL may function to fan out the second level active die, and the plurality of conductive pillars from the one or more first level die on which the second level active die is stacked.

In one embodiment, the package includes a pair of first level die; a first-first level die and a second-first level die arranged side-by-side. In such a configuration the plurality of conductive pillars may include a first row of conductive pillars protruding from a front side of the first-first level die, and a second row of conductive pillars protruding from a front side of the second-first level die. A back side of the second level active die may be attached to the front side of the first-first level die and the front side of the second-first level die laterally between the first and second rows of conductive pillars. In accordance with embodiments, the package further includes a second-second level die and a third-second level die laterally adjacent to opposite sides of the second level active die. For example, the second level active die may be rectangular, the first and second rows of conductive pillars are laterally adjacent to a first pair of laterally opposite sides of the second level active die, and the second-second level die and the third-second level die are laterally adjacent to a second pair of laterally opposite sides of the second level active die. In such a configuration, short electrical routing paths to each different edge of the second level active die can be achieved. For example, the RDL may be formed on an in electrical contact with the second level active die, and provide short routing paths to the first and second rows of conductive pillars that are laterally adjacent to a first pair of laterally opposite sides of the second level active die, and provide short routing paths to the second-second level die and the third-second level die that are laterally adjacent to a second pair of laterally opposite sides of the second level active die.

In one aspect, embodiments, describe system on chip (SoC) die partitioning and/or die splitting within an SiP structure (e.g. 3D memory package) in which short communication paths between die are achievable. In accordance with embodiments, SoC die partitioning of IP cores such as CPU, GPU, I/O, DRAM, SRAM, cache, ESD, power management, and/or integrated passives includes segregating different IP cores into different die within the package. Such die partitioning may additionally allow the integration of different process nodes into separate die. By way of example, different IP cores can be separate die processed at different process nodes. Additionally, a partitioned IP core may be split into different die. In accordance with embodiments, routing densities between the die can be relieved, for example, by providing short routing paths to each edge of an active die. In some embodiments, an active die may be a die that includes active IP cores that benefit from relieved routing densities and short routing paths, such as a central processing unit/general processing unit (CPU/GPU) die. In an embodiment, the package is a 3D memory package, such as a wide I/O DRAM package, including short routing paths to the edges of an active die, such as a CPU/GPU die. In an embodiment, the one or more first level die are memory die, such as, but not limited to, DRAM. In an embodiment, the additional second level die, such as the second-second level die and the third-second level die are a partitioned IP core, such as, but not limited to, split I/O die.

In one aspect, short communication paths between die are facilitated by a thinned second level active die and rows of conductive pillars being formed on the one or more first level die (e.g. first-first level die and second-second level die) and along edges of the one or more first level die. In addition to providing short communication paths, embodiments may also mitigate total z-height of the package, and allow for high routing densities with mitigated routing jam. In accordance with embodiments, a thickness of the second level active die and conductive pillars may be in the range of 30 µm-80 µm tall. In this manner, not only is z-height savings realized, it is possible to form narrow conductive pillars. In an embodiment, an exemplary conductive pillar is 20 µm wide, though narrower or wider conductive pillars may be formed, for example, easily within a 10:1 (height: diameter) aspect ratio. In this aspect, the reduced thickness of the second level active die allows for the formation of conductive pillars with substantially less width (or diameter) compared to common through silicon vias (TSVs) such as those in a traditional interposer. In accordance with embodiments, the pitch between conductive pillars in the rows of conductive pillars may be 40 µm-70 µm (in x and/or y dimensions) on the front surface of the first level die. In this aspect, short communication paths between the second level active die and first level die within the first package level are possible, and at high densities. For example, a pitch of 40 µm (in x and/or y dimensions) between conductive pillars in a row of pillars corresponds to a density of 25×25 per $mm^2$ (or 625 per $mm^2$) and pitch of 70 µm (in x and/or y dimensions) corresponds to a density of 14.28×14.28 per $mm^2$ (or 204 per $mm^2$).

Figure 1B:
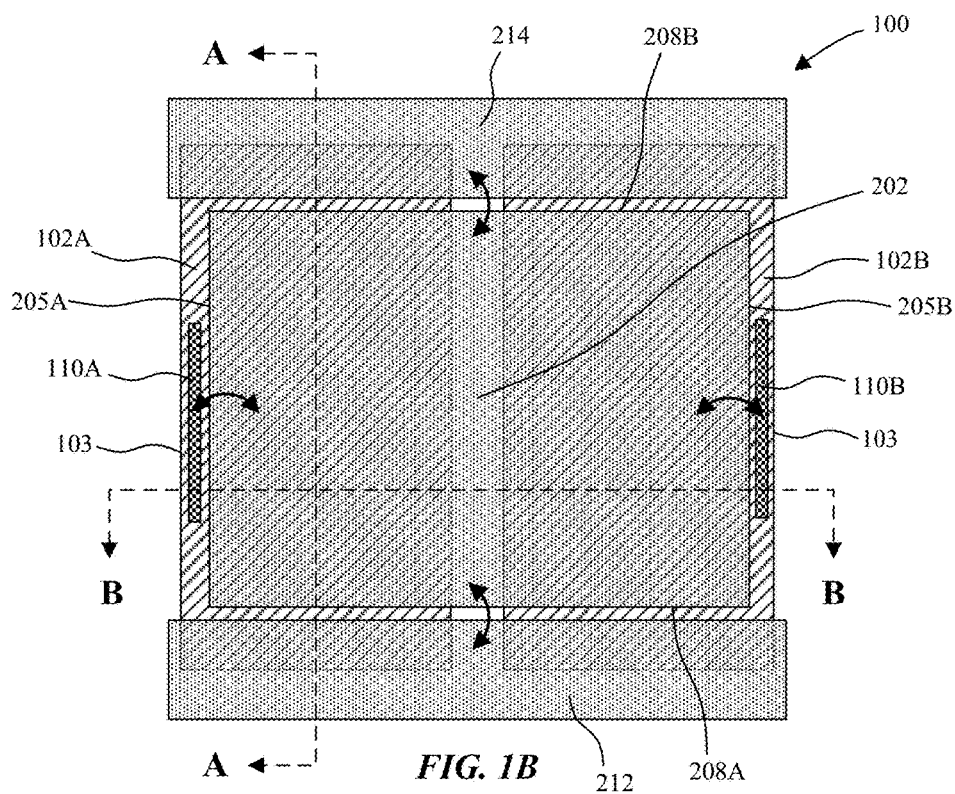
FIG. 1B is a schematic top view illustration the die and conductive pillars in FIG. 1A in accordance with an embodiment.

Referring now to FIGS. 1A-1B, FIG. 1A is a perspective view illustration of a package first and second level die and close-up view of a row of conductive pillars, and FIG. 1B is a schematic top view illustration the die and conductive pillars in FIG. 1A in accordance with an embodiment. In the embodiment illustrated, a package 100 includes a first-first level die 102A and a second-first level die 102B arranged side-by-side. A first row 110A of conductive pillars 112 protrudes from a front side 104 of the first-first level die 102A, and a second row 110B of conductive pillars 112 protrudes from a front side 104 of the second-first level die 102B. The rows 110A, 110B of conductive pillars 112 may be parallel to the adjacent edges 103 of the corresponding first level die 102A, 102B. A back side 206 (see FIGS. 3A-3B) of a second level active die 202 is attached to the front side 104 of the first-first level die 102A and the front side 104 of the second-first level die 102B laterally between the first and second rows 110A, 110B of conductive pillars 112. In an embodiment, the conductive pillars 112 are 30 µm-80 µm tall and separated by a pitch of 40 µm-70 µm (in x and/or y dimensions). For example, the conductive pillars 112 may be 20 µm in diameter, though larger and smaller diameters (or widths) are possible.

Still referring to FIGS. 1A-1B, the package 100 may include additional second level die, such as a second-second level die 212 and a third-second level die 214 laterally adjacent to opposite sides of the second level active die 202. In the particular embodiment illustrated, the second level active die 202 is rectangular, though other shapes are possible in accordance with embodiments. As shown, the first and second rows 110A, 110B of conductive pillars 112 are laterally adjacent (and parallel) to a first pair of laterally opposite sides 205A, 205B of the second level die 202. As shown, the second-second level die 212 and the third-second level die 214 are laterally adjacent (and parallel to) a second pair of laterally opposite sides 208A, 208B of the second level active die 202, respectively. In such a configuration, short electrical routing paths (illustrated by arrows) to each different edge of the second level active die 202 can be achieved. For example, an RDL 300 (see FIGS. 3A-3B, for example) may be formed on an in electrical contact with the second level active die 202, the first and second rows 110A, 110B of conductive pillars, and the second-second level die 212 and the third-second level die 214

It is to be appreciated, that the particular arrangement of a pair of first level die 102A, 102B, and a pair of second-second level die 212 and third-second level die 214 are exemplary. While the particular arrangement may be used to form short electrical routing paths to each side of the second level die 202, other configurations are possible. Accordingly, while the following description is made with regard to the particular stacking arrangement illustrated in FIGS. 1A-1B, embodiments are not necessarily so limited. Additionally, in the following description, a plurality of first level die may be referred to herein with reference number 102 (while also indicating first-first level die 102A and a second-first level die 102B), and a plurality of conductive pillars 112 may be referred to with reference number 110 (while also indicating first and second rows 110A, 110B).

FIG. 2 is a flow chart illustrating a method of forming a package 100 in accordance with an embodiment. At operation 2010 a back side of a second level active die is attached to a front side of one or more first level die 102, such that the second level active die 202 is laterally between a first row 110A of conductive pillars 112 and a second row 110B of conductive pillars 112 protruding from the one or more first level die 102. At operation 2020 the second level active die 202, the first row 110A of conductive pillars 112, and the second row 110B of conductive pillars 112 are in a molding compound layer. At operation, 2030, a thickness of the molding compound layer is removed to expose the first row 110A of conductive pillars 112, the second row 110B of conductive pillars 112, and a front side of the second level active die. In an embodiment, a thickness of the molding compound layer is removed by grinding (e.g. chemical mechanical polishing) to expose a surface of a plurality of conductive studs of the second level active die 202. In other embodiments, the molding compound layer may be selectively patterned to expose the conductive pillars and landing pads on the second level active die 202. Where other die, such as second-second level die 212 and third-second level die 214 are present, reducing the thickness of the molding compound layer may also expose the front side of the second-second level die 212 and third-second level die 214. At operation 2040, an RDL is formed on and in electrical connection with the front side of the second level active die 202, the first row 110A of conductive pillars 112, and the second row 110B of conductive pillars 112, and optionally, the front side of the second-second level die 212 and third-second level die 214, if present.

In accordance with embodiments, the method of forming a package 100 described with regard to FIG. 2 may be combined with various stacking and fan out processes to achieve package layouts such as those illustrated in FIGS. 1A-1B. FIGS. 3A-10 and the related description describe using a fan out build up process with planarized stud surfaces on the first level die in accordance with an embodiment. FIGS. 11A-17 and the related description describe using a fan out build up process with pre-formed conductive pillars and a single reconstituted carrier substrate in accordance with an embodiment. FIGS. 18A-24 and the related description describe using a face down reconstituted carrier substrate approach in accordance with an embodiment. While the processing sequences are illustrated and described separately, the separate processing sequences may share some similar structures and processes, which in the interest of conciseness and clarity may not necessarily be described separately herein where such descriptions would be unduly repetitive.

Figure 3A:
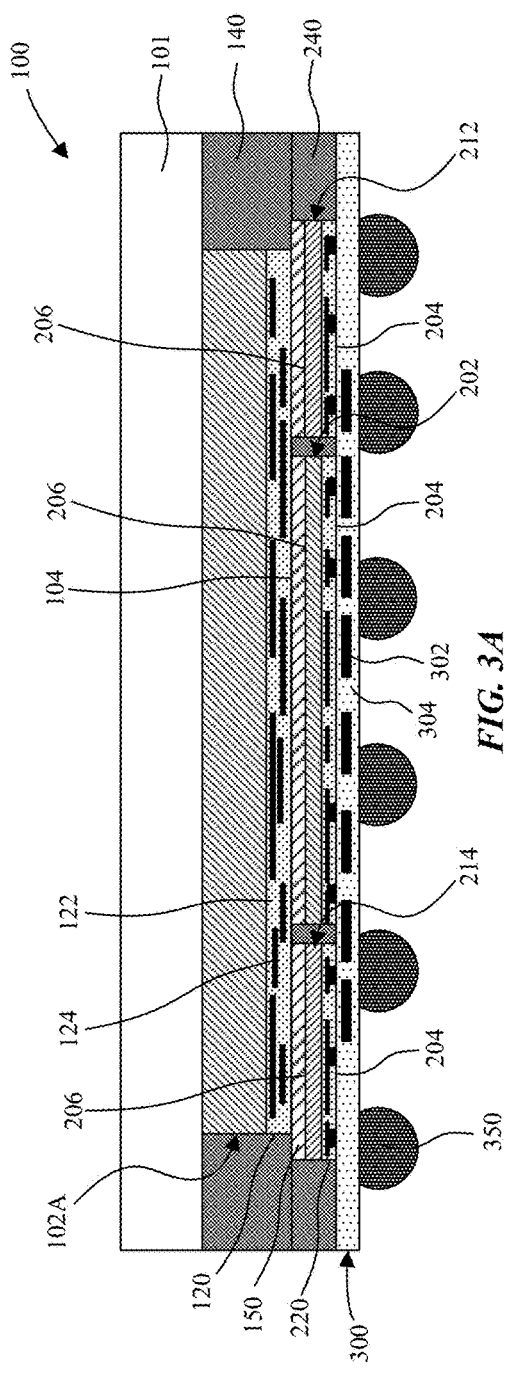
FIG. 3A is a cross-sectional side view illustration of a package taken along line A-A in FIG. 1B formed using a fan out build up process with planarized stud surfaces on the first level die in accordance with an embodiment.
Figure 3B:
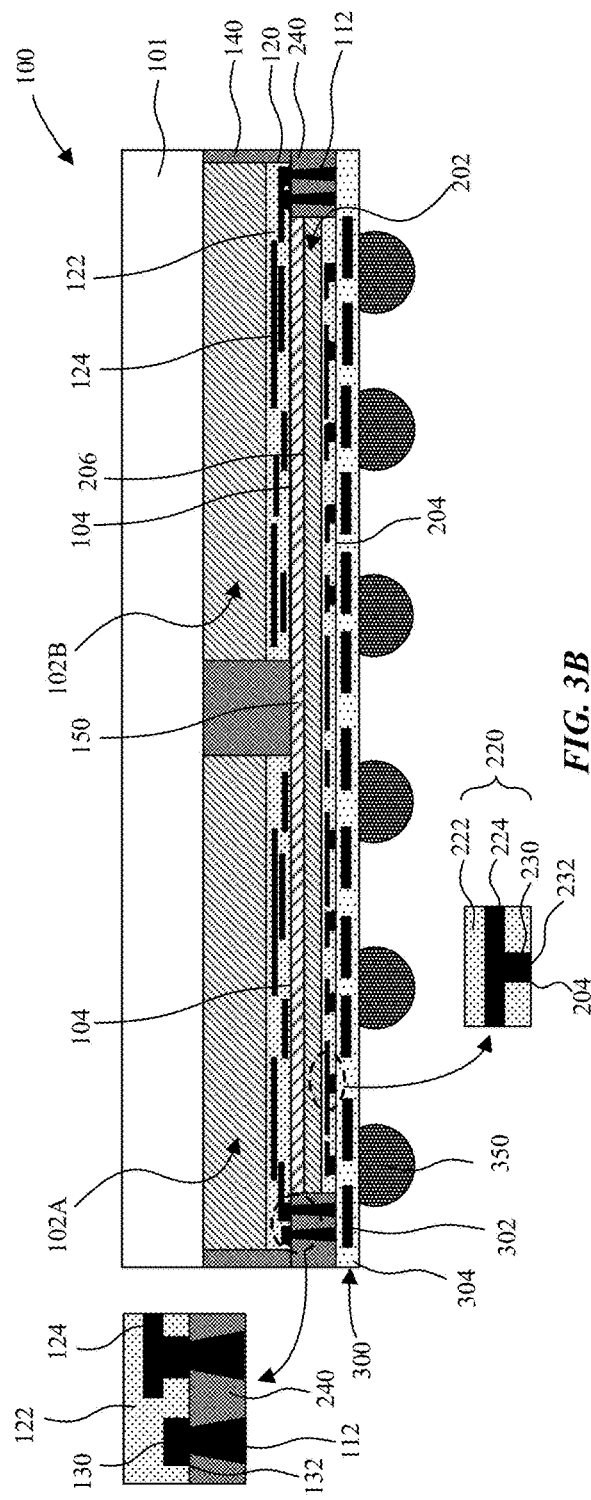
FIG. 3B is a cross-sectional side view illustration of a package taken along line B-B in FIG. 1B formed using a fan out build up process with planarized stud surfaces on the first level die in accordance with an embodiment.

Referring now to FIGS. 3A-3B, FIG. 3A is a cross-sectional side view illustration of a package taken along line A-A in FIG. 1B formed using a fan out build up process with planarized stud surfaces on the first level die in accordance with an embodiment. FIG. 3B is a cross-sectional side view illustration of a package taken along line B-B in FIG. 1B formed using a fan out build up process with planarized stud surfaces on the first level die in accordance with an embodiment.

In accordance with embodiments, package 100 includes one or more first level die 102, and a plurality of conductive pillars 110 extending from a front side 104 of the one or more first level die 102. The plurality of pillars 112 may extend from a build-up layer 120 of the first level die 102. A back side 206 of a second level active die 202 is attached to the front side 104 of the one or more first level die 102, for example, with a die attach film 150. Similarly, the back sides 206 of the second-second level die 212 and the third-second level die 214 may be attached to the front side 104 of the one or more first level die 102, for example, with a die attach film 150. An RDL 300 is formed on and in electrical contact with the plurality of conductive pillars 112 and a front side 204 of the second level active die 202, and front sides 204 of the second-second level die 212 and the third-second level die 214. In this manner, the RDL 300 may function to fan out the second level active die 202, the plurality of conductive pillars 112 from the one or more first level die 102 on which the second level active die 202 is stacked, the second-second level die 212, and the third-second level die 214.

The RDL 300 may include one or more redistribution lines 302 and dielectric layers 304. The RDL 300 may be formed by a layer-by-layer process, and may be formed using thin film technology. In an embodiment, the RDL 300 has a thickness of 20-50 μm. A pattern of conductive bumps 350 (e.g. solder bumps) may be attached to a back side of the RDL 300.

In accordance with embodiments, the second level active die 202, the second-second level die 212, and the third-second level die 214 may include build-up layers 220. The build-up layers 220 may include one or more electrically insulating layers 222 and conductive (e.g. metal) routing layers 224. In an embodiment, the build-up layers 220 include a plurality of conductive studs 230 (for example extending from a pattern of routing layers 224). In accordance with embodiments, the front sides 204 of the second level active die 202, the second-second level die 212, and the third-second level die 214 may include a planarized front surface of the build-up layers 220 including a plurality of conductive stud 230 surfaces 232.

In accordance with embodiments, the one or more first level die 102 may include similar build-up layers 120, that may include one or more electrically insulating layers 122 and conductive (e.g. metal) routing layers 124. In the particular embodiment illustrated in FIGS. 3A-3B, the build-up layer 120 includes a plurality of conductive studs 130 (for example extending from a pattern of routing layers 124) and the front side 104 of each of the first level die 102 is a planarized front surface of the build-up layer 120 including a plurality of conductive stud 130 surfaces 132. In such an embodiment, the plurality of conductive pillars 112 extend from the plurality of conductive stud 130 surfaces 132.

Still referring to FIGS. 3A-3B, the first level die 102A, 102B are encapsulated within a first level molding compound layer 140 on a carrier substrate 101. The carrier substrate 101 may be temporary and removed from the final package 100 structure. Alternatively, the carrier substrate 101 may be retained in the final package 100 structure, for example, as a heat slug. Carrier substrate 101 may be formed of a variety of materials, such as glass. The second level active die 202, and the second-second level die 212 and third-second level die 214, if present, may be encapsulated within a second level molding compound layer 240. The first and second level molding compound layers 140, 240 may be include a thermosetting cross-linked resin (e.g. epoxy), though other materials may be used as known in electronic packaging. The first and second level molding compound layers 140, 240 may be formed of the same or different materials.

Figure 4:
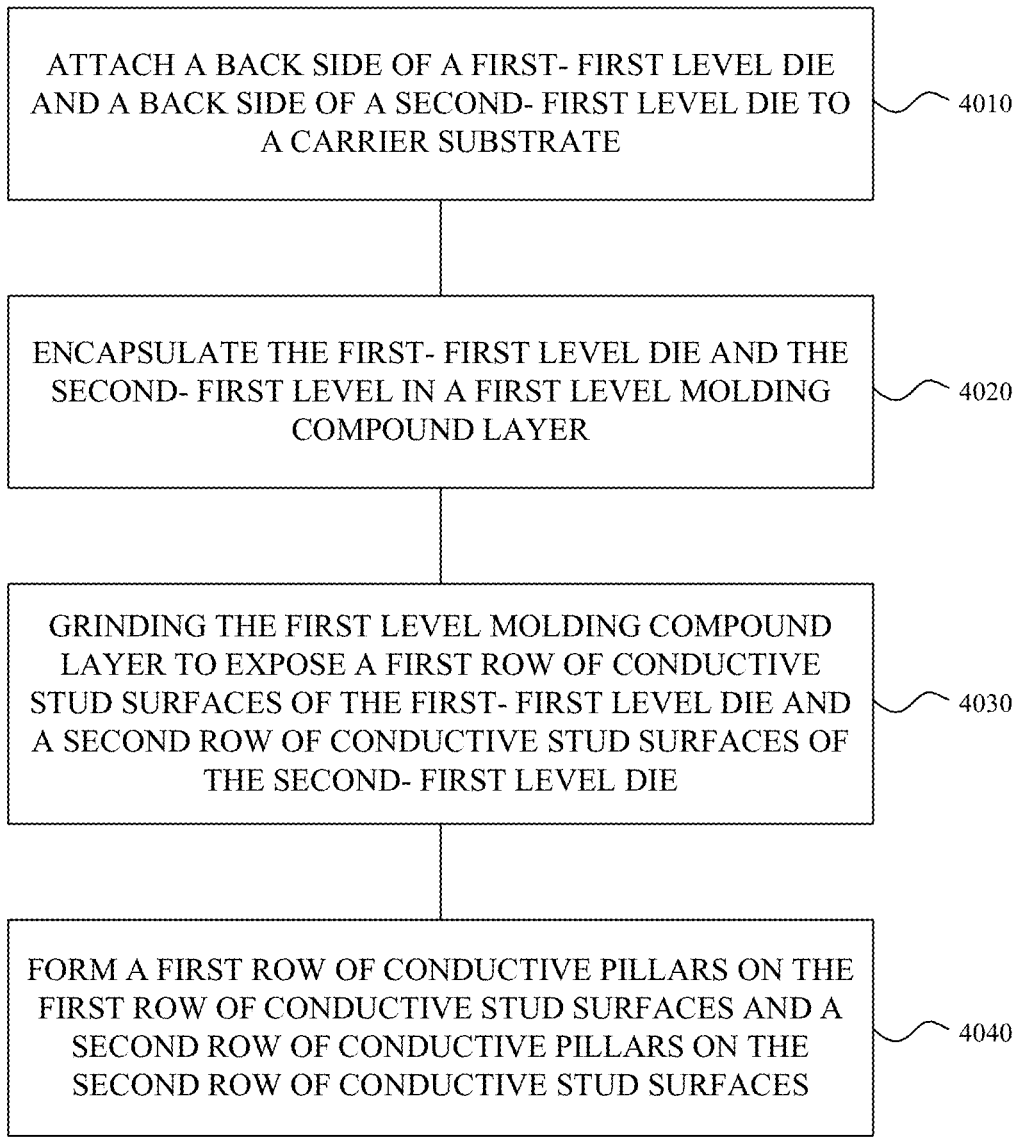
FIG. 4 is a flow chart illustrating a method of forming a package using a fan out build up process with planarized stud surfaces on the first level die in accordance with an embodiment.

FIG. 4 is a flow chart illustrating a method of forming a packages illustrated in FIGS. 3A-3B using a fan out build up process with planarized stud surfaces in accordance with an embodiment. In the following description of the embodiment illustrated in FIG. 4, reference is made to the cross-sectional side view illustrations of the embodiments illustrated in FIGS. 5-10, taken along line B-B of FIG. 1B.

Figure 5:
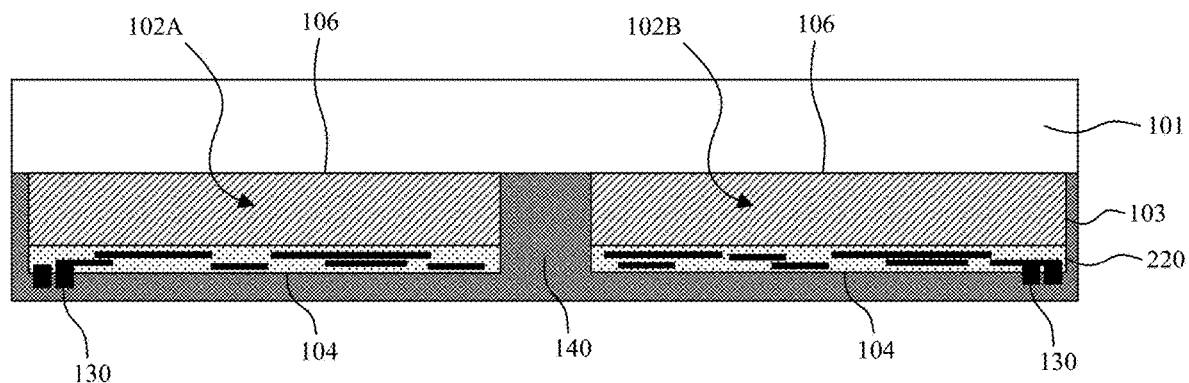
FIG. 5-10 are cross-sectional side view illustrations taken along line B-B in FIG. 1B of a method of forming a package using a fan out build up process within planarized stud surfaces on the first level die in accordance with an embodiment.

Referring now to FIG. 5, at operation 4010 a back side 106 of a first-first level die 102A and a back side 106 of a second-first level die 102B are attached to a carrier substrate 101. For example, the plurality of first level die 102 may optionally be attached to a tape layer on the carrier substrate 101. The carrier substrate 101 may be a variety of substrates, and may be temporary or permanent in the final package. In an embodiment, the carrier substrate 101 is a glass substrate. In the embodiment illustrated in FIG. 5, the first level die 102A, 102B each include a plurality of conductive studs 130 that protrude from the front sides 104 of the first level die 102A, 102B. In an embodiment, the conductive studs 130 are arranged in rows parallel to the adjacent edges 103 of the first level die 102A, 102B. In an embodiment, the rows of conductive studs 130 may include multiple individual rows within a macro scale row of conductive studs, similar to the rows 110A, 110B of conductive pillars 112 illustrated in FIG. 1A, with a reduced height. The height of the conductive studs 130 protruding from the remainder of the front side 104 may be enough to accommodate for thickness variability in the first level die 102, and first level molding compound layer 140 applied at operation 4020. The material of conductive studs 130 can include, but is not limited to, a metallic material such as copper, titanium, nickel, gold, and combinations or alloys thereof. In an embodiment, conductive studs 130 are copper. In accordance with embodiments, the first level die 102A, 102B including conductive studs 130 protruding from the front sides 104 are transferred and attached to the carrier substrate 101. In such an embodiment, the conductive studs 130 are pre-existing at the time of the pick and place transfer. This may be facilitated, for example, by the location of the conductive studs 130 along the edges 130 of the first level die 102A, 102B.

At operation 4020 the first-first level die 102A and the second-first level die 102B are encapsulated in a first level molding compound layer 140. The first level molding compound layer 140 may include a thermosetting cross-linked resin (e.g. epoxy), though other materials may be used as known in electronic packaging. Encapsulation may be accomplished using a suitable technique such as, but not limited to, transfer molding, compression molding, and lamination. In the embodiment illustrated, the first level molding compound 140 covers the front sides 104 of the first level die 102A, 102B, and optionally covers the plurality (e.g. rows) of conductive studs 130.

Figure 6:
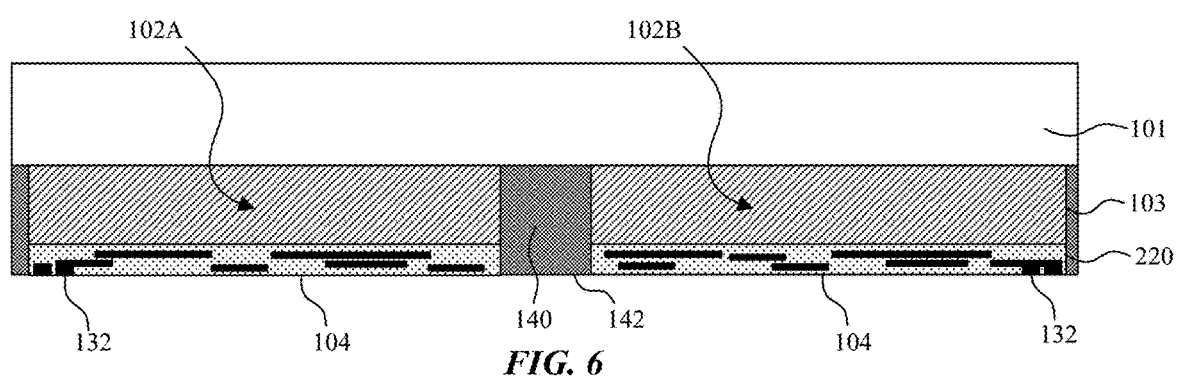

Referring now to FIG. 6, at operation 4030 the first level molding compound layer 140 is ground to expose a first row of conductive stud surfaces 132 of the first-first level die 102A and a second row of conductive stud surfaces 132 of the second-first level die 102B. For example, grinding may be performed by chemical mechanical polishing (CMP), resulting in coplanar first level molding compound layer surface 142, and front surfaces 104 of the first level die 102A, 102B including the conductive stud surfaces 132. In application, some amount of the electrically insulating layers 222 of the build-up layers 220 may also be removed.

Figure 7:
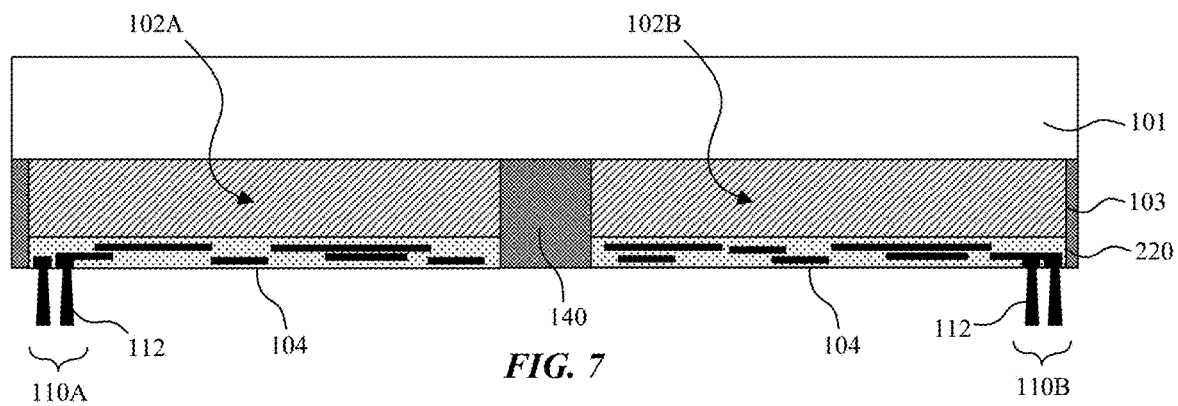

Referring now to FIG. 7, at operation 4040 a first row 110A of conductive pillars 112 is formed on the first row of conductive stud surfaces 132, and a second row 110B of conductive pillars 112 is formed on the second row of conductive stud surfaces 132. In an embodiment, the conductive pillars 112 are formed by a plating technique, such as electroplating using a patterned photoresist to define the conductive pillar 112 dimensions, followed by removal of the patterned photoresist layer. The material of conductive pillars 112 can include, but is not limited to, a metallic material such as copper, titanium, nickel, gold, and combinations or alloys thereof. In an embodiment, conductive pillars 112 are copper.

Figure 8:
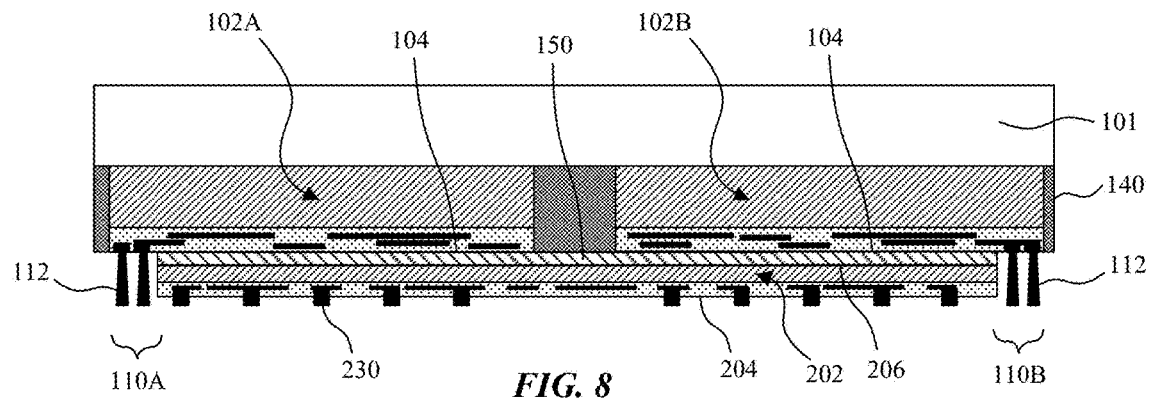

Following the formation of the plurality of conductive pillars 112, in an embodiment the packaging process may proceed as described with regard to FIG. 2. Referring now to FIG. 8, a back side 206 of a second level active die 202 is attached to front sides 104 of the first level die 102A, 102B, such that the second level active die 202 is laterally between the first row 110A of conductive pillars 112 and the second row 110B of conductive pillars 112 protruding from the first level die 102A, 102B.

In accordance with embodiments, the second level active die 202 including conductive studs 230 protruding from the front side 204 is transferred and attached to the first level die 102A, 102B, for example using a die attach film 150. In such an embodiment, the conductive studs 230 are pre-existing at the time of the pick and place transfer. This may be facilitated, for example, by an open area not including conductive studs 230 in a center of the second level die 202.

While not illustrated separately in the process sequence illustrated in FIGS. 5-10, additional second level die may also be transferred and attached to the first level die 102A and/or 102B. For example, referring back to the cross-sectional illustration in FIG. 3A taken along line A-A of FIG. 1B, a second-second level die 212 and third-second level die 214 are illustrated as being attached to the one or more first level die 102, for example using a die attach film 150. In accordance with embodiments, the additional second level die, such as second-second level die 212 and third-second level die 214 may also include conductive studs 230 protruding from their front sides 204.

Figure 9:
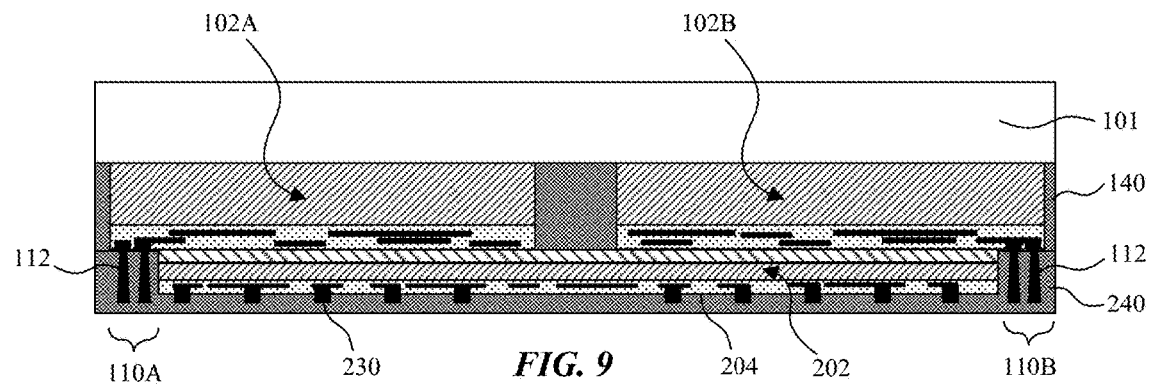

Referring now to FIG. 9, the second level active die 202, the first row 110A of conductive pillars 112, and the second row 110B of conductive pillars are encapsulated in a second level molding compound layer 240. Likewise, additionally second level die, such as second-second level die 212 and third-second level die 214 may also be encapsulated within the second level molding compound layer 240. The second level molding compound layer 240 may include a thermosetting cross-linked resin (e.g. epoxy), though other materials may be used as known in electronic packaging. The second level molding compound layer 240 may be the same material as the first level molding compound layer 140. Encapsulation may be accomplished using a suitable technique such as, but not limited to, transfer molding, compression molding, and lamination. In the embodiment illustrated, the second level molding compound layer 240 covers the front sides 204 of the second level active die 202, the first row 110A of conductive pillars, the second row 110B of conductive pillars, and the plurality of conductive studs 230. Likewise, the second level molding compound layer 240 may cover any conductive studs 230 of the second-second level die 212 and third-second level die 214.

Figure 10:
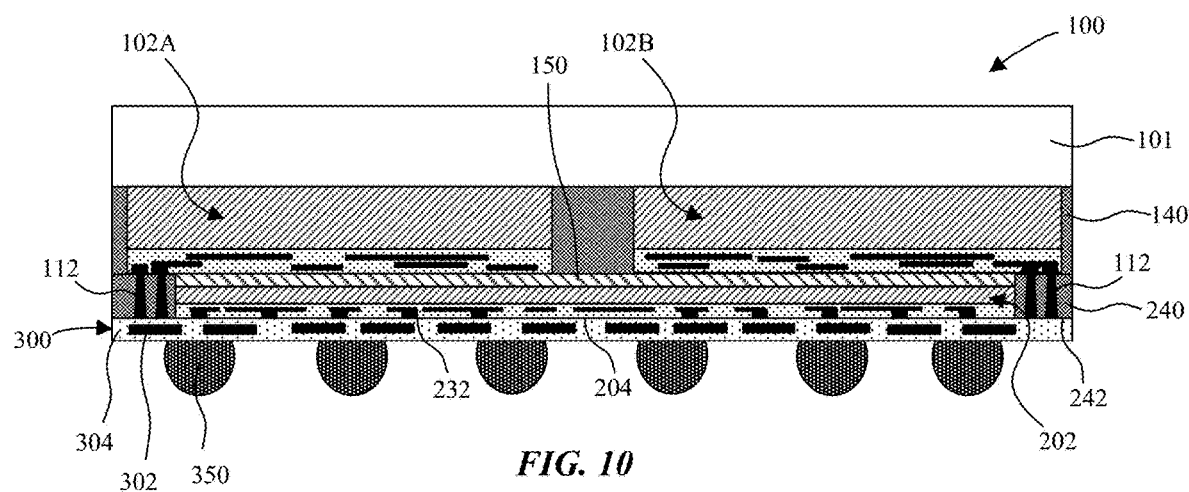

Referring now to FIG. 10, the second level molding compound 240 is ground to expose the first row 110A of conductive pillars 112, the second row 110B of conductive pillars 112, the surfaces 232 of the plurality of conductive studs 230 of the second level active die 202, and the surfaces 232 of the plurality of conductive studs 230 on the second-second level die 212 and third-second level die 214, when present. For example, grinding may be performed by chemical mechanical polishing (CMP), resulting in coplanar second level molding compound layer surface 242, and front surfaces 204 of the second level active die 202, second-second level die 212 and third-second level die 214 including the conductive stud surfaces 232. In application, some amount of the electrically insulating layers 222 of the build-up layers 220 may also be removed.

In an embodiment, the conductive pillars 212 are 30 μm-80 μm tall after the grinding operation. In an embodiment, the second level active die 202, second-second level die 212 and third-second level die 214 are somewhat thinner than the height of the conductive pillars 212, which is the result of accommodating for the die attach film 150 thickness. Overall, the second package level including the die attach film 150, second level active die 202, second-second level die 212 and third-second level die 214 (including the build-up layers) is 30 μm-80 μm tall/thick in an embodiment.

In the particular embodiment illustrated in FIG. 10, a grinding operation is used to reduce the thickness of the molding compound layer, and expose the conductive pillars 212 and conductive studs 230. A grinding operation may be utilized in order to reduce overall thickness of the second package level. In other embodiments, the second level molding compound layer 240 may be selectively patterned to expose the conductive pillars and landing pads on the second level active die 202, second-second level die 212 and third-second level die 214.

Still referring to FIG. 10, an RDL 300 is formed on and in electrical connection with the (e.g. planarized) front side 204 of the second level active die 202 (e.g. on an in electrical connection with surfaces 232 of conductive studs 230), the first row 110A of conductive pillars 112, and the second row of conductive pillars 110B, and optionally, the front side 204 of the second-second level die 212 and third-second level die 214, if present. In this manner, the RDL 300 may function to fan out the second level active die 202, the plurality of conductive pillars 112 from the one or more first level die 102 on which the second level active die 202 is stacked, the second-second level die 212, and the third-second level die 214.

The RDL 300 may include one or more redistribution lines 302 and dielectric layers 304. The RDL 300 may be formed by a layer-by-layer process, and may be formed using thin film technology. In an embodiment, the RDL 300 has a thickness of 20-50 μm. For example, the redistribution lines 302 may be created by first forming a seed layer, followed by forming a metal (e.g. copper) pattern. Alternatively, redistribution lines 302 may be formed by deposition (e.g. sputtering) and etching. The material of redistribution lines 302 can include, but is not limited to, a metallic material such as copper, titanium, nickel, gold, and combinations or alloys thereof. The metal pattern of the redistribution lines 302 is then embedded in a dielectric layer 304, which is optionally patterned. The dielectric layer(s) 304 may be any suitable material such as an oxide, or polymer (e.g. polyimide). In an embodiment, the redistribution lines 302 are formed directly on the surfaces 232 of conductive studs 230, and conductive pillars 112.

A pattern of conductive bumps 350 (e.g. solder bumps) may be attached to a back side of the RDL 300, for example for attaching the package 100 to a circuit board. In accordance with embodiments, the carrier substrate 101 may optionally be removed or retained, for example, as a heat slug. Individual packages 100 may then be singulated from the reconstituted substrate.

Referring now to FIGS. 11A-11B, FIG. 11A is a cross-sectional side view illustration of a package taken along line A-A in FIG. 1B formed using a fan out build up process with pre-formed conductive pillars and single reconstituted carrier substrate in accordance with an embodiment. FIG. 11B is a cross-sectional side view illustration of a package taken along line B-B in FIG. 1B formed using a fan out build up process with pre-formed conductive pillars and single reconstituted carrier substrate in accordance with an embodiment. FIGS. 11A-11B are substantially similar to FIGS. 3A-3B, with certain structural distinctions. In the embodiment illustrated, the first level die 102A, 102B, second level active die 202, the plurality of conductive pillars 112 (e.g. rows 110A, 110B), and the second-second level die 212 and third-second level die 214 are encapsulated within a single molding compound layer 244. In the embodiment illustrated, the plurality of conductive pillars 112 extend from (or protrude from) a corresponding plurality of landing pads 160 in the build-up layer 120 of the first level die 102A, 102B.

In accordance with embodiments, the landing pads 160 can assume a variety of configurations. In the specific embodiment illustrated, landing pads 160 resemble under bump metallurgy (UBM) defined landing pads formed over an opening in electrically insulating layer 122, and in contact with a routing layer 124. Alternatively, landing pads 160 may correspond to exposed areas of a routing layer 124.

Figure 12:
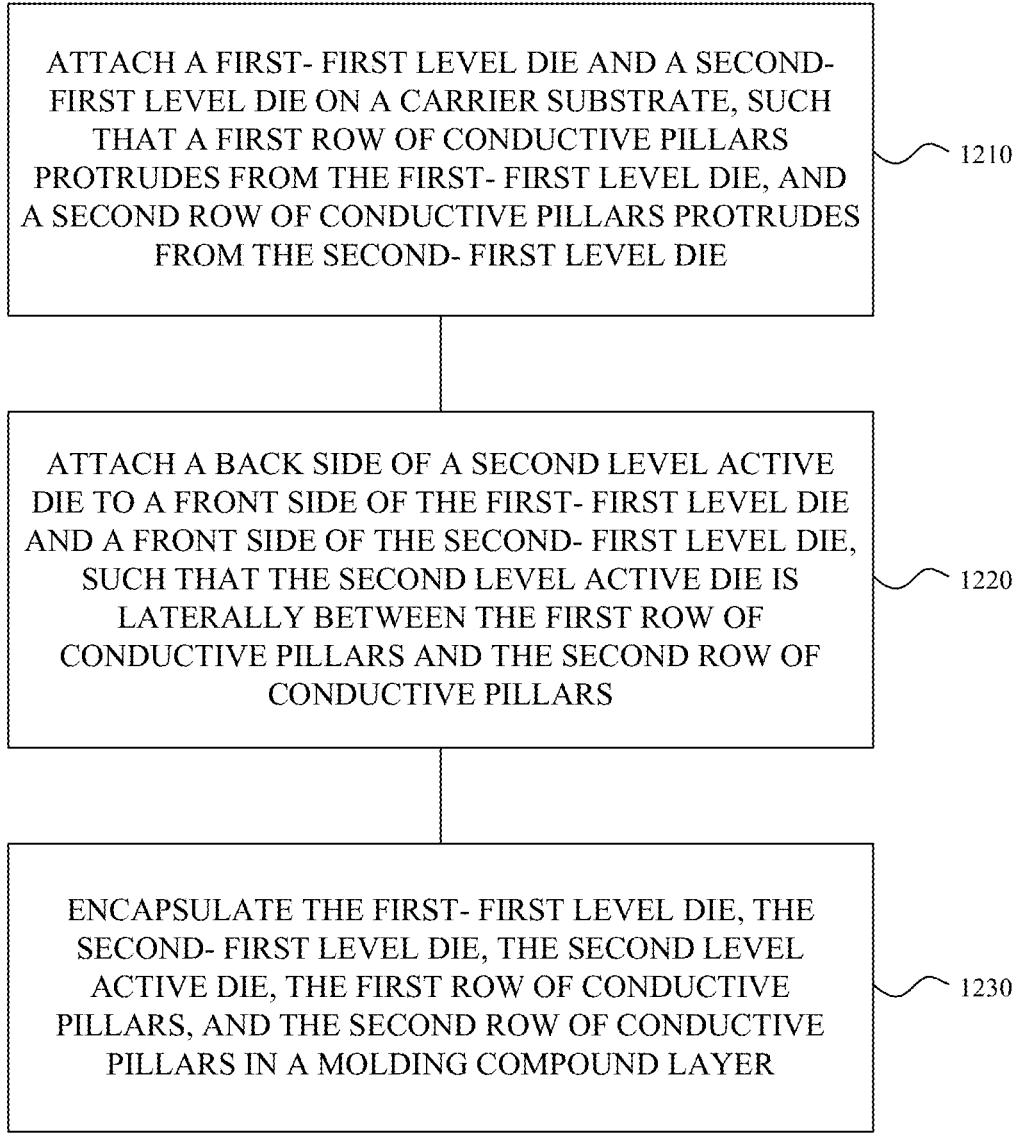
FIG. 12 is a flow chart illustrating a method of forming a package using a fan out build up process with pre-formed conductive pillars and single reconstituted carrier substrate in accordance with an embodiment.

FIG. 12 is a flow chart illustrating a method of forming packages illustrated in FIGS. 11A-11B using a fan out build up process with pre-formed conductive pillars and single reconstituted carrier substrate in accordance with an embodiment. In the following description of the embodiment illustrated in FIG. 12, reference is made to the cross-sectional side view illustrations of the embodiments illustrated in FIGS. 13-18, taken along line B-B of FIG. 1B.

Figure 13:
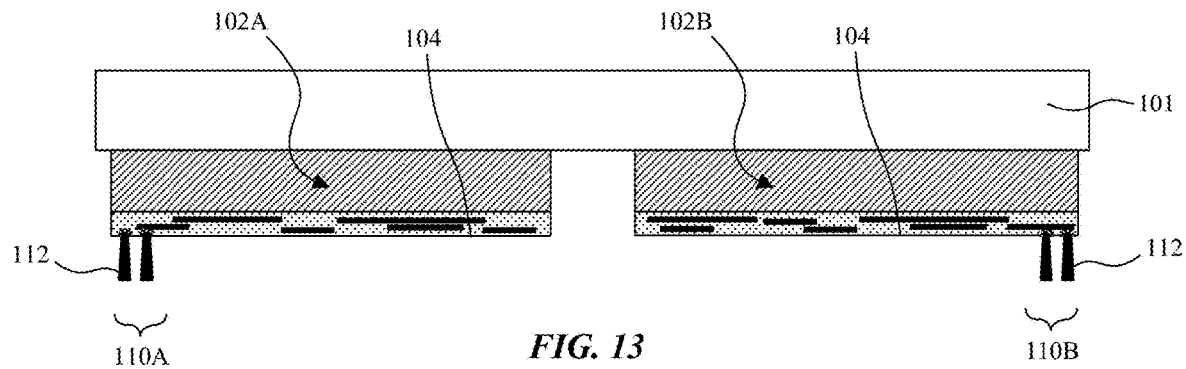
FIG. 13-17 are cross-sectional side view illustrations taken along line B-B in FIG. 1B of a method of forming a package using a fan out build up process with pre-formed conductive pillars and single reconstituted carrier substrate in accordance with an embodiment.

Referring now to FIG. 13, at operation 1210 a back side 106 of a first-first level die 102A and a back side 106 of a second-first level die 102B are attached to a carrier substrate 101. For example, the plurality of first level die 102 may optionally be attached to a tape layer on the carrier substrate 101. The carrier substrate 101 may be a variety of substrates, and may be temporary or permanent in the final package. In an embodiment, the carrier substrate 101 is a glass substrate. In the embodiment illustrated in FIG. 13, the first level die 102A, 102B each include a plurality of conductive pillars 112 that protrude from the front sides 104 of the first level die 102A, 102B. For example, the conductive pillars 112 may extend from landing pads 160 in the build-up layers 120 of the first level die 102A, 102B. In accordance with embodiments, the landing pads 160 may be separate pad layers, similar to UBM pads, or areas of the routing layers 124. In an embodiment, the conductive pillars 112 are arranged in rows parallel to the adjacent edges 103 of the first level die 102A, 102B. In an embodiment, the rows of conductive pillars 112 may include multiple individual rows within a macro scale row of conductive pillars, similar to the rows 110A, 110B of conductive pillars 112 illustrated in FIG. 1A.

In accordance with embodiments, the first level die 102A, 102B including conductive pillars 112 protruding from the front sides 104 are transferred and attached to the carrier substrate 101. In such an embodiment, the conductive pillars 112 are pre-existing at the time of the pick and place transfer. This may be facilitated, for example, by the location of the conductive pillars 112 along the edges 130 of the first level die 102A, 102B. The first level die 102A, 102B illustrated in FIG. 13 may be substantially similar to the first level die 102A, 102B illustrated and described with regard to FIG. 5, with one difference being the formation of conductive pillars 112 as opposed to conductive studs 130.

Figure 14:
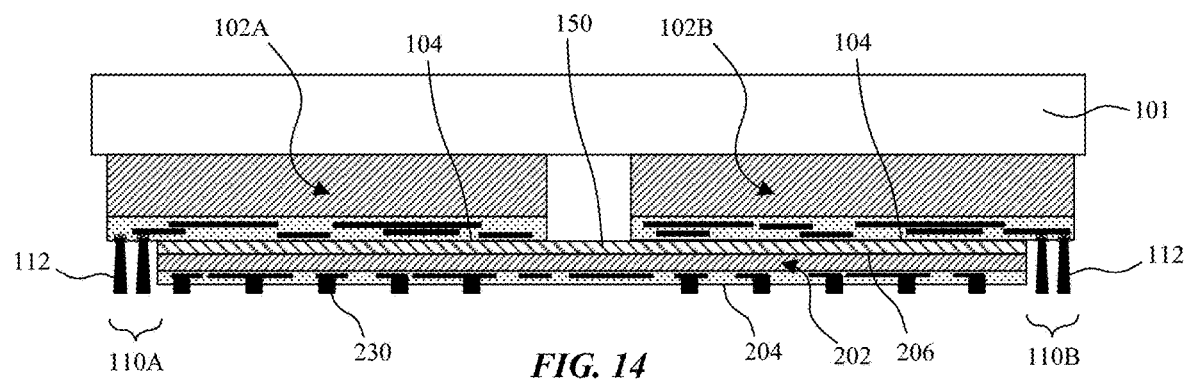

Referring now to FIG. 14, at operation 1220 a back side of a second level active die 202 is attached to a front side of the first-first level die 102A and a front side of the second-first level die 102B, so that the second level active die 202 is laterally between the first row 110A of conductive pillars 112 and the second row 110B of conductive pillars 112. The attachment process illustrated and described with regard to FIG. 14 may be similar to that illustrated and described with regard to operation 2010, and FIG. 8. One difference between the embodiment illustrated in FIG. 14, and the embodiment illustrated in FIG. 8 is that a planarized first level molding compound surface is not present. In the embodiment, illustrated in FIG. 14, the second active level die 202 is attached to the front surfaces 104 of the first level die 102A, 102B with a die attach film 150, and may span across an open space between the first-first level die 102A and the second-first level die 102B. The second-second level die 212 and third-second level die 214 may be similarly attached.

Figure 15:
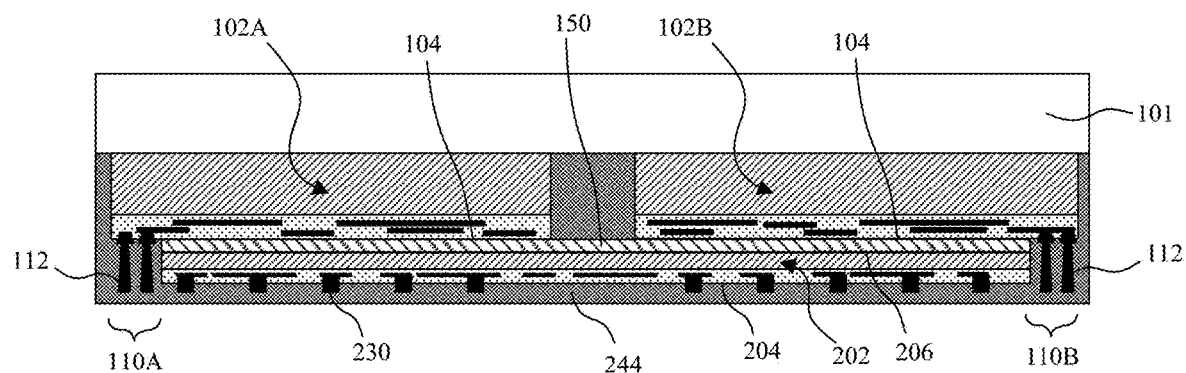

Referring now to FIG. 15, at operation 1230 the first-first level die 102A, the second-first level die 102B, the second level active die 202, the first row 110A of conductive pillars 112, and the second row 110B of conductive pillars 112 are encapsulated within a molding compound layer 244. Similarly, the second-second level die 212 and third-second level die 214 may be encapsulated within the molding compound layer 244. The molding operation 1230 may be similar to that previously described with regard to FIG. 9, with the exception being that both the first package level including the first level die 102 are also encapsulated within the single molding compound layer 244, which also fills the space between the first-first level die 102A and the second-first level die 102B. In this manner, the process illustrated of FIG. 12, describes a fan out build up process with a single molding operation, and the formation of a single reconstituted carrier substrate.

Figure 16:
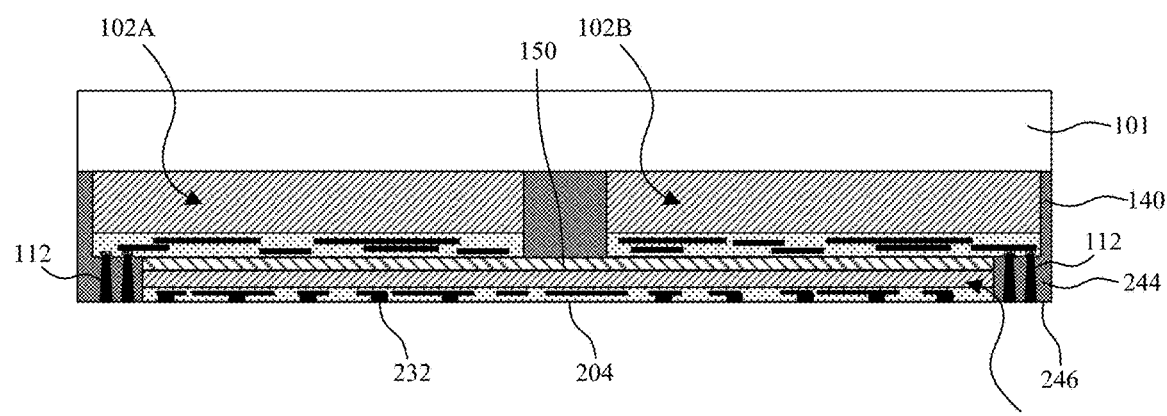
Figure 17:
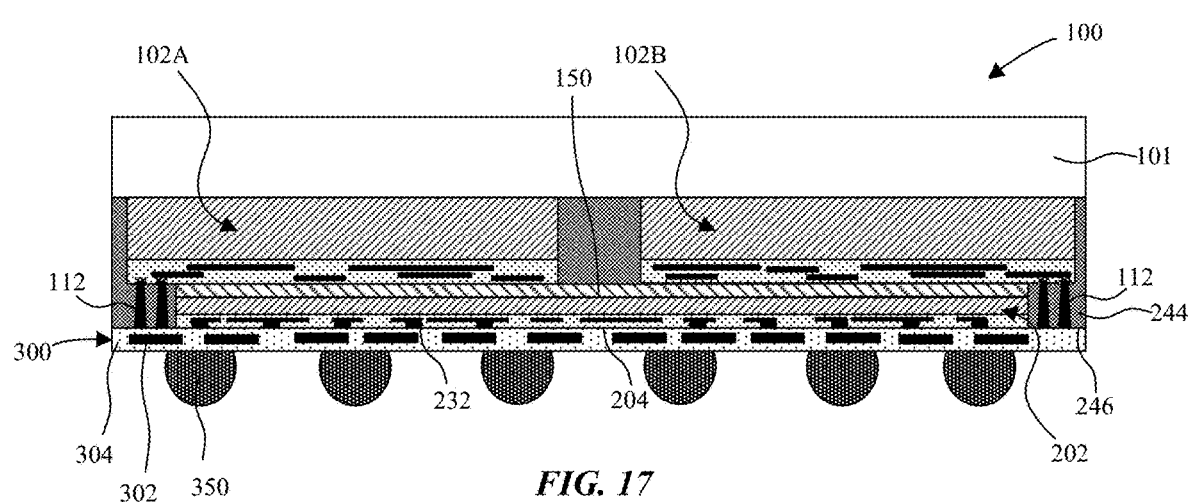

Referring now to FIGS. 16-17, the molding compound layer 244 is ground to expose the first row 110A of conductive pillars 112, the second row 110B of conductive pillars 112, the surfaces 232 of the plurality of conductive studs 230 of the second level active die 202, and the surfaces 232 of the plurality of conductive studs 230 on the second-second level die 212 and third-second level die 214, when present, similarly as described above with regard to FIG. 10. As shown, the grinding operation may create a planar molding compound layer surface 246.

In the particular embodiment illustrated in FIG. 16, a grinding operation is used to reduce the thickness of the molding compound layer 244, and expose the conductive pillars 212 and conductive studs 230. A grinding operation may be utilized in order to reduce overall thickness of the second package level. In other embodiments, the molding compound layer 244 may be selectively patterned to expose the conductive pillars and landing pads on the second level active die 202, second-second level die 212 and third-second level die 214.

Referring now to FIG. 17, an RDL 300 is formed on and in electrical connection with the (e.g. planarized) front side 204 of the second level active die 202 (e.g. on an in electrical connection with surfaces 232 of conductive studs 230), the first row 110A of conductive pillars 112, and the second row 110B of conductive pillars 112, and optionally, the front side 204 of the second-second level die 212 and third-second level die 214, if present, similarly as described above with regard to FIG. 10. In accordance with embodiments, the carrier substrate 101 may optionally be removed or retained, for example, as a heat slug. Individual packages 100 may then be singulated from the reconstituted substrate.

Referring now to FIGS. 18A-18B, FIG. 18A is a cross-sectional side view illustration of a package taken along line A-A in FIG. 1B formed using a face down reconstituted carrier substrate approach in accordance with an embodiment. FIG. 18B is a cross-sectional side view illustration of a package taken along line B-B in FIG. 1B formed using a face down reconstituted carrier substrate approach in accordance with an embodiment.

FIGS. 18A-18B share similarities with FIGS. 3A-3B and FIGS. 11A-11B, with certain structural distinctions. In the embodiment illustrated, the plurality of conductive pillars 112 extend from (or protrude from) a corresponding plurality of landing pads 160 in the build-up layer 120 of the first level die 102A, 102B similarly as with regard to FIGS. 11A-11B. In the embodiment illustrated, the first level die 102A, 102B are encapsulated within a first level molding compound layer 140, and the second level active die 202 and the plurality of conductive pillars 112 are encapsulated within a second level molding compound layer 240. As illustrated, the first level molding compound layer 140 may optionally cover the back sides 106 of the first level die 102A, 102B. In an embodiment, the first level molding compound layer 140 thickness can optionally be reduced, for example to expose the first level die 102A, 102B. In accordance with embodiments, the process flow for fabricating the package 100 illustrated in FIGS. 18A-18B can incorporate thick first level die 102A, 102B, and the first level molding compound layer 140 encapsulating the first level die 102A, 102B may be self supporting, and be used as a reconstituted substrate during processing without the need of an additional support substrate.

Figure 19:
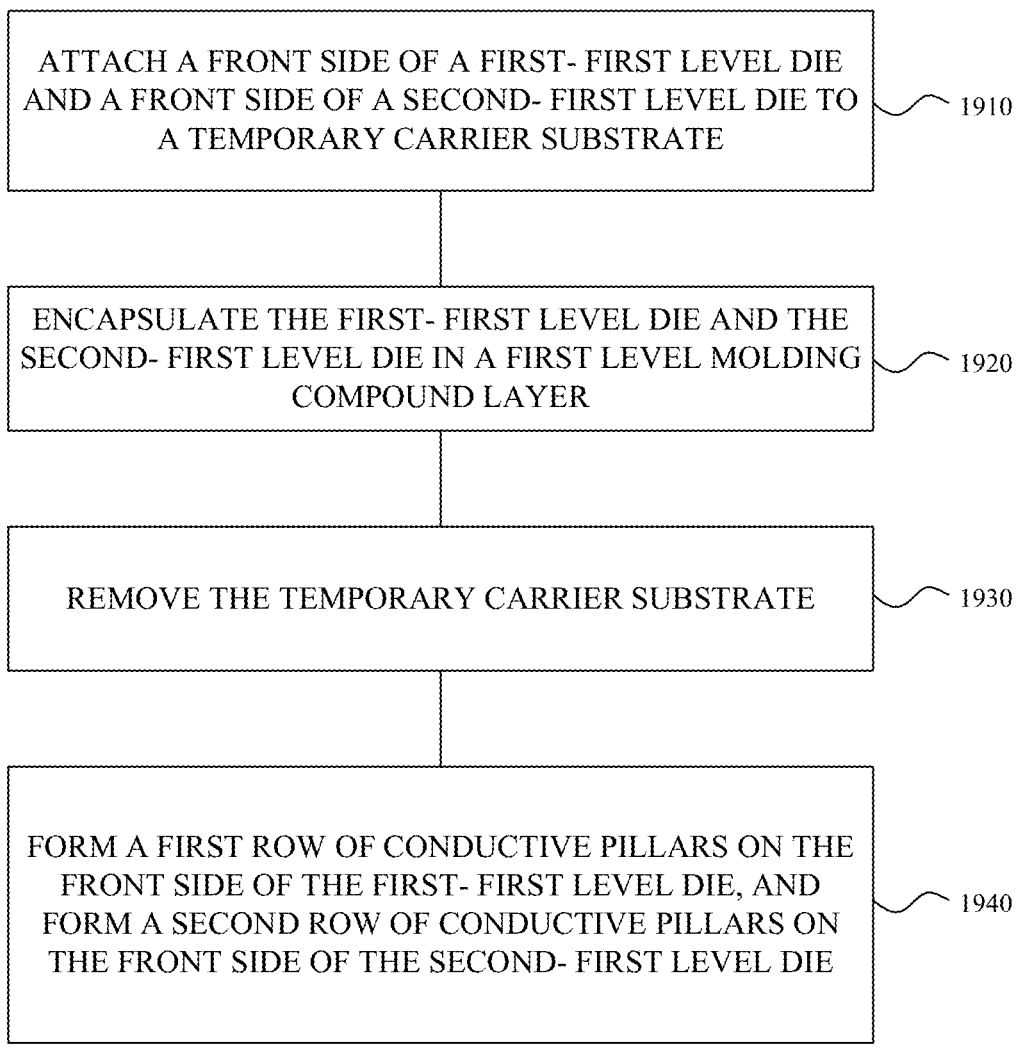
FIG. 19 is a flow chart illustrating a method of forming a package using a face down reconstituted carrier substrate approach in accordance with an embodiment.
Figure 20:
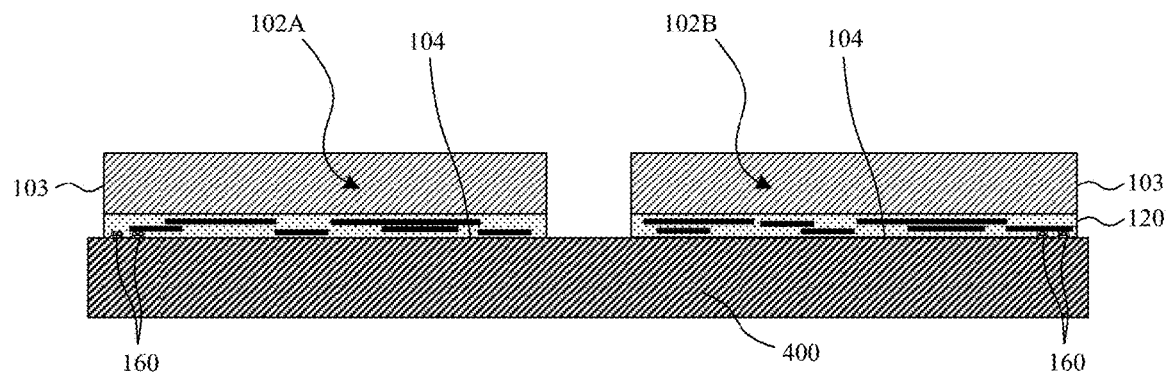
FIG. 20-24 are cross-sectional side view illustrations taken along line B-B in FIG. 1B of a method of forming a package using a face down reconstituted carrier substrate approach in accordance with an embodiment.

FIG. 19 is a flow chart illustrating a method of forming packages illustrated in FIGS. 18A-18B using a face down reconstituted carrier substrate approach in accordance with an embodiment. In the following description of the embodiment illustrated in FIG. 19, reference is made to the cross-sectional side view illustrations of the embodiments illustrated in FIGS. 20-24, taken along line B-B of FIG. 1B. Referring now to FIG. 20, at operation 1910 a front side 104 of a first-first level die 102A and a front side 104 of a second-first level die 102B are attached to a temporary carrier substrate 400. For example, the plurality of first level die 102 may optionally be attached to a tape layer on the temporary carrier substrate 400. The carrier substrate 400 may be a variety of substrates, such as metal, glass, etc. In the embodiment illustrated, the front side 104 of the first level die 102 include a plurality of landing pads 160 in the build-up layers 120. In accordance with embodiments, the landing pads 160 may be separate pad layers, similar to UBM pads, or areas of the routing layers 124. In an embodiment, the landing pads 160 are arranged in rows parallel to the adjacent edges 103 of the first level die 102A, 102B. In an embodiment, the rows of landing pads 160 may include multiple individual rows within a macro scale row of landing pads 160, similar to the rows 110A, 110B of conductive pillars 112 illustrated in FIG. 1A.

Figure 21:
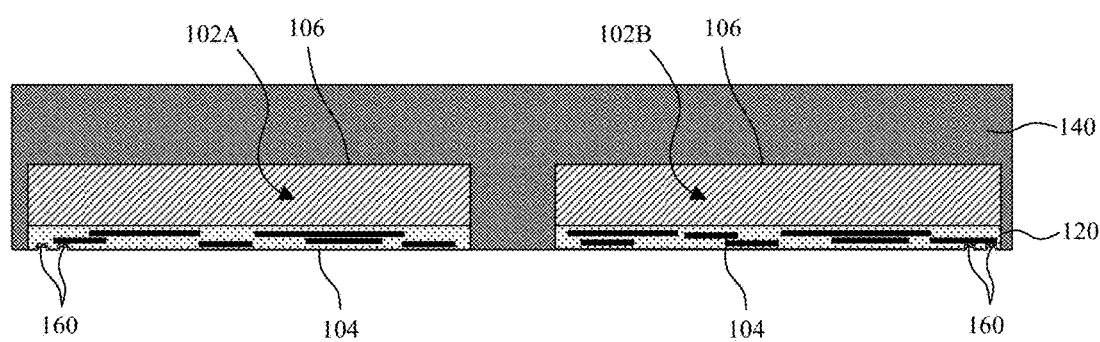

Referring to FIG. 21, at operation 1920 the first-first level die 102A and the second-first level die 102B are encapsulated within a first level molding compound layer 140 on the temporary carrier substrate 400. The first level molding compound layer 140 may include a thermosetting cross-linked resin (e.g. epoxy), though other materials may be used as known in electronic packaging. Encapsulation may be accomplished using a suitable technique such as, but not limited to, transfer molding, compression molding, and lamination. In the embodiment illustrated, the first level molding compound 140 covers the back sides 106 of the first level die 102A, 102B. At operation 1930 the temporary carrier substrate 400 is removed, resulting in a reconstituted substrate with exposed front sides 104 of the first-first level die 102A and the second-first level die 102B. In accordance with embodiments, the reconstituted substrate illustrated in FIG. 21 may be self supporting for subsequent processing.

Figure 22:
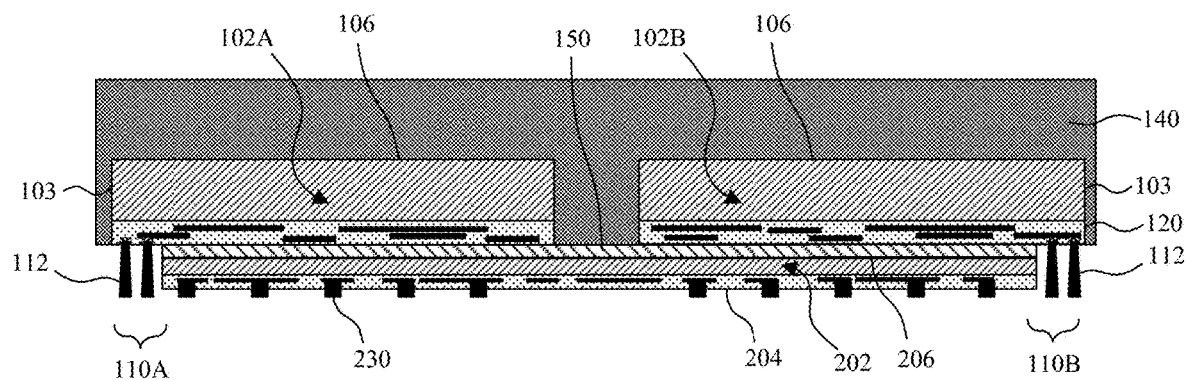

Referring now to FIG. 22, at operation 1940 a first row 110A of conductive pillars 112 is formed on the first row of landing pads 160, and a second row 110B of conductive pillars 112 is formed on the second row of landing pads 160. In an embodiment, the conductive pillars 112 are formed by a plating technique, such as electroplating using a patterned photoresist to define the conductive pillar 112 dimensions, followed by removal of the patterned photoresist layer. The material of conductive pillars 112 can include, but is not limited to, a metallic material such as copper, titanium, nickel, gold, and combinations or alloys thereof. In an embodiment, conductive pillars 112 are copper.

Following the formation of the plurality of conductive pillars 112, in an embodiment the packaging process may proceed as described with regard to FIG. 2. Referring again to FIG. 22, a back side 206 of a second level active die 202 is attached to front sides 104 of the first level die 102A, 102B, such that the second level active die 202 is laterally between the first row 110A of conductive pillars 112 and the second row 110B of conductive pillars 112 protruding from the first level die 102A, 102B.

In accordance with embodiments, the second level active die 202 including conductive studs 230 protruding from the front side 204 is transferred and attached to the first level die 102A, 102B, for example using a die attach film 150. In such an embodiment, the conductive studs 230 are pre-existing at the time of the pick and place transfer. This may be facilitated, for example, by an open area not including conductive studs 230 in a center of the second level die 202.

While not illustrated separately in the process sequence illustrated in FIGS. 20-24, additional second level die may also be transferred and attached to the first level die 102A and/or 102B. For example, referring back to the cross-sectional illustration in FIG. 18A taken along line A-A of FIG. 1B, a second-second level die 212 and third-second level die 214 are illustrated as being attached to the one or more first level die 102, for example using a die attach film 150. In accordance with embodiments, the additional second level die, such as second-second level die 212 and third-second level die 214 may also include conductive studs 230 protruding from their front sides 204.

Figure 23:
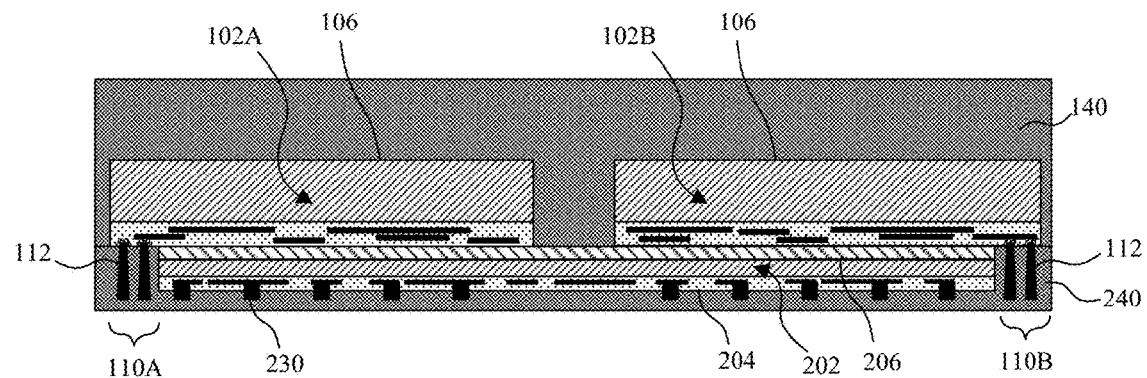
Figure 24:
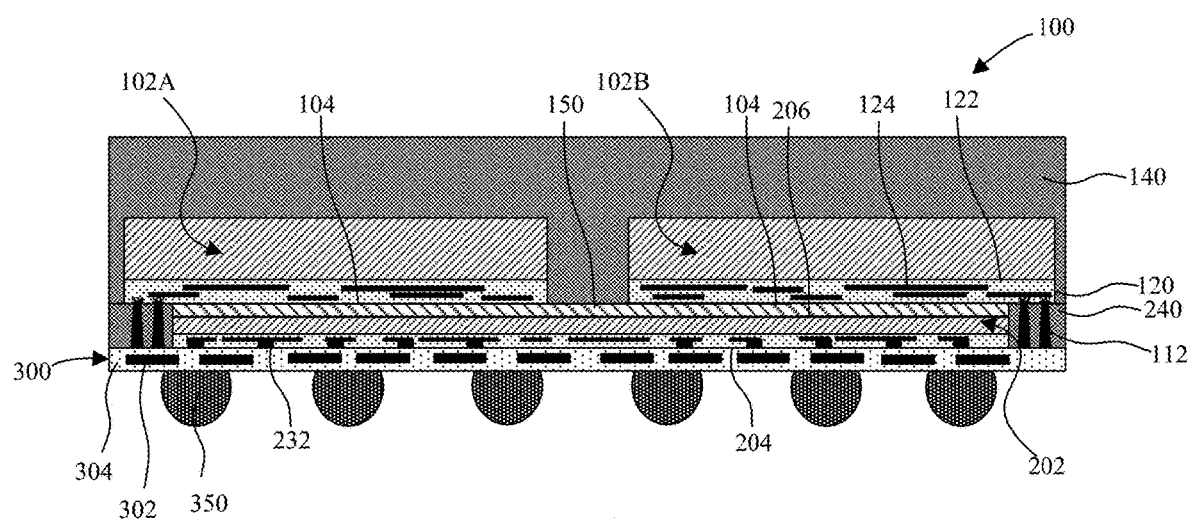

Referring now to FIGS. 23-24, in accordance with embodiments, the reconstituted substrate structure may be processed similarly as previously described with regard to FIGS. 9-10. Prior to or after attaching conductive bumps 350 (e.g. solder bumps) to the back side of the RDL 300, a thickness of the first level molding compound layer 140 may optionally be reduced. Individual packages 100 may then be singulated from the reconstituted substrate.

In utilizing the various aspects of the embodiments, it would become apparent to one skilled in the art that combinations or variations of the above embodiments are possible for forming a 3D die stack with fan out. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
   a first-first level die and a second-first level die arranged side-by-side;
   a first row of conductive pillars protruding from a first plurality of landing pads in a first build-up layer in a front side of the first-first level die;
   a second row of conductive pillars protruding from a second plurality of landing pads in a second build-up layer in a front side of the second-first level die;
   a back side of a second level active die attached to the front side of the first-first level die and the front side of the second-first level die, wherein the back side of the second level active die does not include a plurality of landing pads and the first and second rows of conductive pillars are laterally adjacent to a first pair of laterally opposite sides of the second level active die;
   a second-second level die and a third-second level die laterally adjacent to a second pair of laterally opposite sides of the second level active die; and
   a redistribution layer (RDL) on and in electrical contact with the first and second rows of conductive pillars and front sides of the second level active die, the second-second level die and the third-second level die;
   wherein the first row of conductive pillars is located along a first edge of the first-first level die, the second row of conductive pillars is located along a second edge of the second-first level die, the second-second level die covers a third edge of the first-first level die and a third edge of the second-first level die, and the third-second level die covers a fourth edge of the first-first level die and a fourth edge of the second-first level die;
   wherein the first row of conductive pillars is located proximally closer to the first edge of the first-first level die than a first center of the first-first level die, the second row of conductive pillars is located proximally closer to the second edge of the second-first level die than a second center of the second-first level die, and lengths of the first row of conductive pillars and the second row of conductive pillars are both shorter than the first pair of laterally opposite sides of the second level active die; and
   wherein the third edge of the first-first level die and the fourth edge of the first-first level die are opposing edges, and the third edge of the second-first level die and the fourth edge of the second-first level die are opposing edges.

2. The package of claim 1, wherein the back side of the second level active die is attached to the first-first level die and the second-first level die with a die attach film, wherein the first row of conductive pillars includes a plurality of parallel first rows of conductive copper pillars that protrude directly from the first plurality of landing pads, and the second row of conductive pillars includes a plurality of parallel second rows of conductive copper pillars that protrude directly from the second plurality of contact pads.

3. The package of claim 1, wherein the second level active die and the first and second rows of conductive pillars are 30 µm-80 µm tall.

4. The package of claim 1,
wherein the first build-up layer of the first-first level die and the second build-up layer of the second-first level die are separated by the first level molding compound layer; and
further comprising a second level molding compound layer on the front side of the first-first level die, the front side of the second-first level die, and on a surface of the first level molding compound layer, wherein the first row of conductive pillars, the second row of conductive pillars, the second level active die, the second-second level die and the third-second level die are encapsulated in the second level molding compound layer.

5. The package of claim 4, wherein the second level active die is rectangular.

6. The package of claim 1, wherein the second-second level die completely covers the third edge of the first-first level die and the third edge of the second-first level die.

7. The package of claim 6, wherein the third-second level die completely covers the fourth edge of the first-first level die and the fourth edge of the second-first level die.

8. The package of claim 1, wherein the front side of the second level active die comprises a planarized front surface of a build-up layer including a plurality of conductive stud surfaces, and the RDL is formed on an in electrical contact with the plurality of conductive stud surfaces of the second level active die.

9. The package of claim 1, wherein the first row of conductive pillars is a first row of conductive copper pillars, and the second row of conductive pillars is a second row of conductive copper pillars.

10. The package of claim 1, wherein the front side of the first-first level die comprises a first planarized front surface of the first build-up layer including a first plurality of conductive stud surfaces, and the first row of conductive pillars extends from the plurality of conductive stud surfaces.

11. The package of claim 1, wherein the back side of the second level active die attached to the front side of the first-first level die with a die attach film.

12. The package of claim 1, further comprising a first level molding compound layer that covers a back side of the first-first level die.

13. A method of forming a package comprising:
attaching a back side of a first-first level die and a back side of a second-first level die on a carrier substrate;
attaching a back side of a second level active die to a front side of the first-first level die and a front side of the second-first level die;
wherein the second level active die includes a first pair of laterally opposite sides laterally between and laterally adjacent to a first row of conductive copper pillars protruding directly from landing pads in a first build-up layer in the first-first level die and a second row of conductive copper pillars protruding directly from landing pads in a second build-up layer in the second-first level die;
attaching a second-second level die and a third-second level die laterally adjacent to a second pair of laterally opposite sides of the second level active die;
wherein the first row of conductive pillars is located proximally closer to a first edge of the first-first level die than a first center of the first-first level die, the second row of conductive pillars is located proximally closer to a second edge of the second-first level die than a second center of the second-first level die, and lengths of the first row of conductive pillars and the second row of conductive pillars are both shorter than the first pair of laterally opposite sides of the second level active die;
encapsulating the second level active die, the second-second level die, the third-second level die, the first row of conductive copper pillars, and the second row of conductive copper pillars in a molding compound layer, such that the first build-up layer of the first-first level die and the second build-up layer of the second-first level die are separated by the molding compound layer;
removing a thickness of the molding compound layer to expose the first row of conductive copper pillars, the second row of conductive copper pillars, and a front side of the second level active die; and
forming a redistribution layer on and in electrical connection with the front side of the second level active die, a front side of the second-second level die, a front side of the third-second level die, the first row of conductive copper pillars, and the second row of conductive copper pillars.

14. The method of claim 13, wherein attaching the back side of the second level active die to the front side of the first-first level die and a front side of the second-first level die comprises:
encapsulating the first-first level die and the second-first level in a first level molding compound layer;
grinding the first level molding compound layer to expose a first row of conductive stud surfaces of the first-first level die and a second row of conductive stud surfaces of the second-first level die; and
forming the first row of conductive copper pillars on the first row of conductive stud surfaces and the second row of conductive copper pillars on the second row of conductive stud surfaces.

15. The method of claim 13, further comprising:
attaching the first-first level die including the first row of conductive copper pillars to the carrier substrate, and attaching the second-first level die including the second row of conductive copper pillars to the carrier substrate; and
attaching the back side of the second level active die to the front side of the first-first level die and the front side of the second-first level die.

16. The method of claim 15, further comprising encapsulating the first-first level die, the second-first level die, the second level active die, the first row of conductive copper pillars, and the second row of conductive copper pillars in the molding compound layer.

17. The method of claim 13, further comprising:
encapsulating the first-first level die and the second-first level die in a first level molding compound layer;
removing the temporary carrier substrate; and
forming the first row of conductive copper pillars on the front side of the first-first level die, and forming the second row of conductive pillars on the front side of the second-first level die.

* * * * *

UNITED STATES PATENT AND TRADEMARK OFFICE
CERTIFICATE OF CORRECTION

PATENT NO. : 11,056,373 B2
APPLICATION NO. : 14/918189
DATED : July 6, 2021
INVENTOR(S) : Jun Zhai, Kwan-Yu Lai and Kunzhong Hu Page 1 of 1

It is certified that error appears in the above-identified patent and that said Letters Patent is hereby corrected as shown below:

In the Claims

Column 15, Line 34, Claim 8, delete "an" and insert in place there of -- and --

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*